United States Patent [19]
Endo et al.

[11] Patent Number: 5,869,850
[45] Date of Patent: Feb. 9, 1999

[54] LATERAL INSULATED GATE BIPOLAR TRANSISTOR

[75] Inventors: Koichi Endo; Nobuyuki Sato, both of Kanagawa-ken, Japan

[73] Assignee: Kabushiki Kaishia Toshiba, Kawasaki, Japan

[21] Appl. No.: 990,077

[22] Filed: Dec. 12, 1997

[30] Foreign Application Priority Data

Dec. 13, 1996 [JP] Japan ................................. 8-334102

[51] Int. Cl.$^6$ ................................................. H01L 29/74
[52] U.S. Cl. ........................................... 257/139; 257/141
[58] Field of Search ....................................... 257/139, 141

[56] References Cited

U.S. PATENT DOCUMENTS 5,126,806   6/1992   Sakurai et al. ........................ 357/23.4

*Primary Examiner*—Olik Chaudhurl
*Assistant Examiner*—Douglas A. Wille
*Attorney, Agent, or Firm*—Oblon, Spivak, McClelland, Maier & Neustadt, P.C.

[57] ABSTRACT

A lateral insulated gate bipolar transistor has an emitter region that is displaced from a main path for passing carriers from a collector region to a base region through a first semiconductor layer. This arrangement suppresses the operation of a parasitic transistor composed of the emitter region, base region, and first semiconductor layer and prevents a latch-up. The width of the gate electrode of covering the first semiconductor layer serving as a drift region of carriers may be widened to form a carrier accumulation layer in the first semiconductor layer adjacent to the gate electrode. The accumulation layer increases the total number of carriers in the drift region, to reduce a saturation voltage between the collector region and the emitter region. As a result, the lateral insulated gate bipolar transistor operates with a low voltage to reduce power consumption.

11 Claims, 18 Drawing Sheets

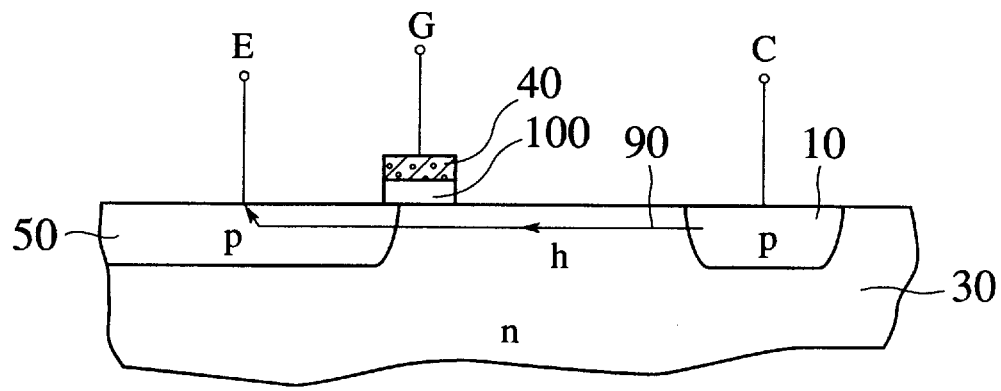
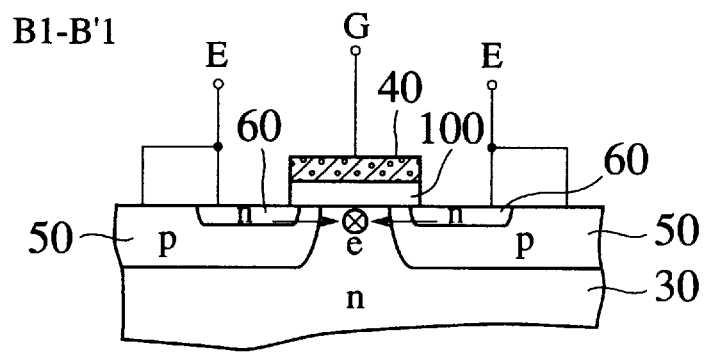
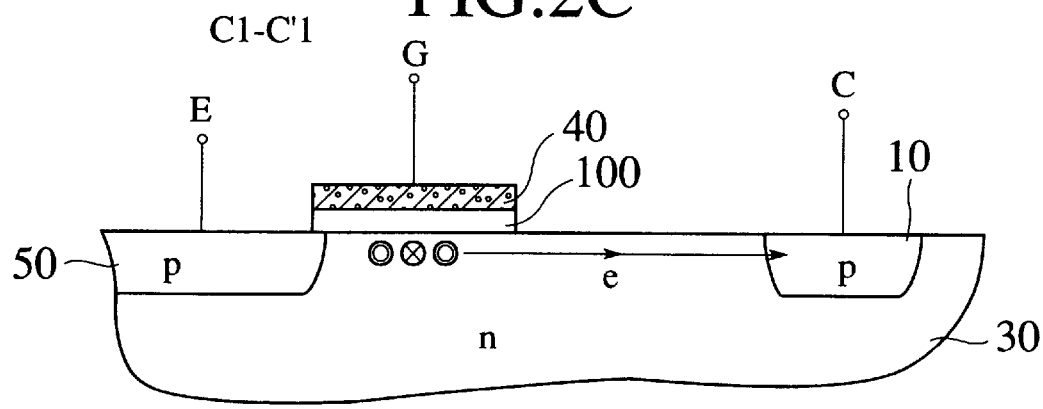

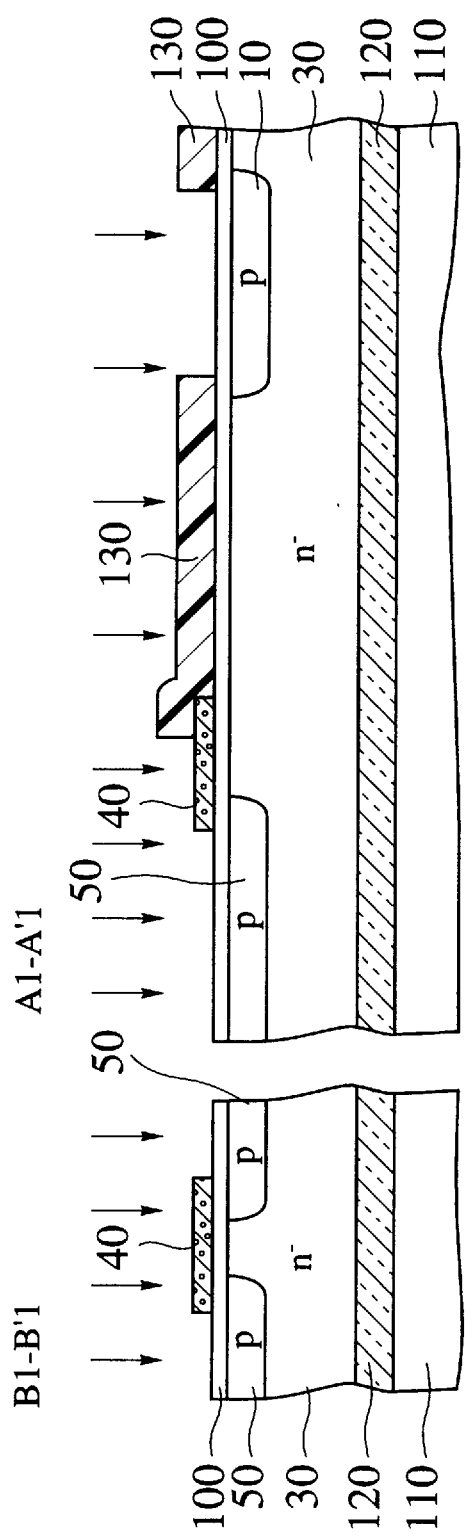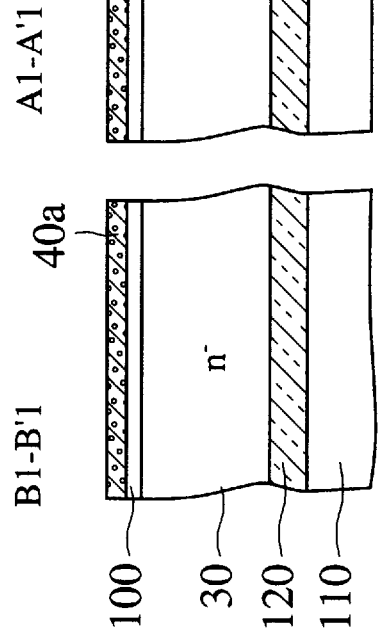

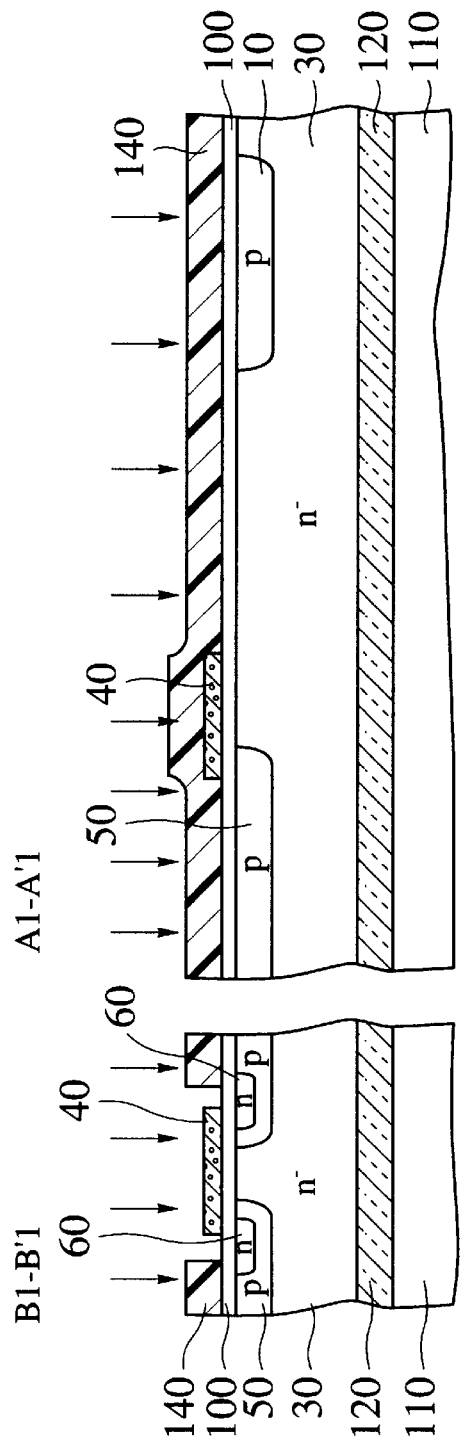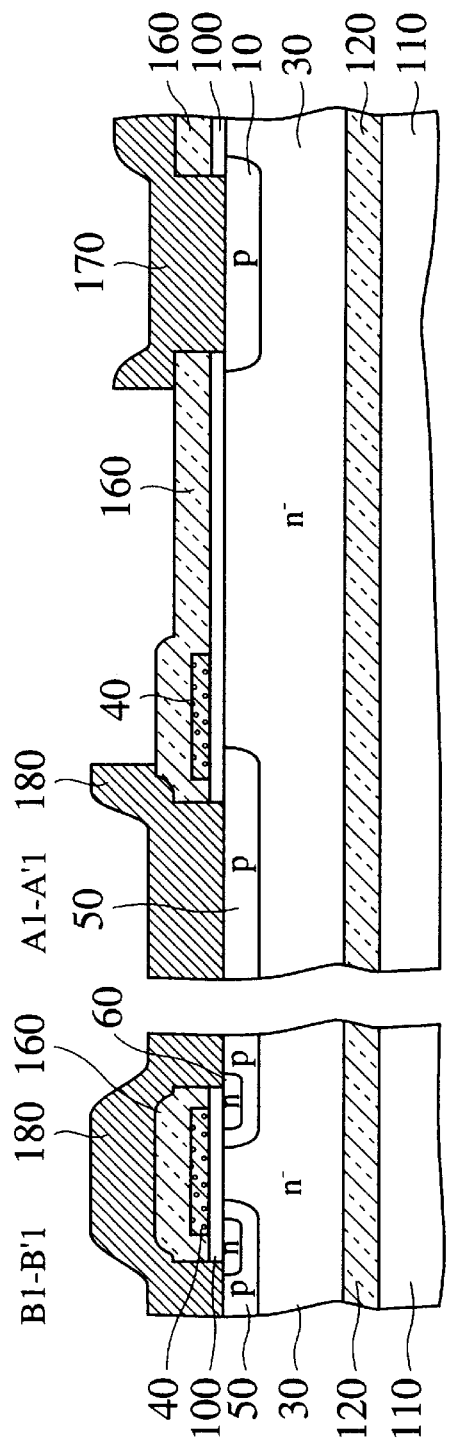

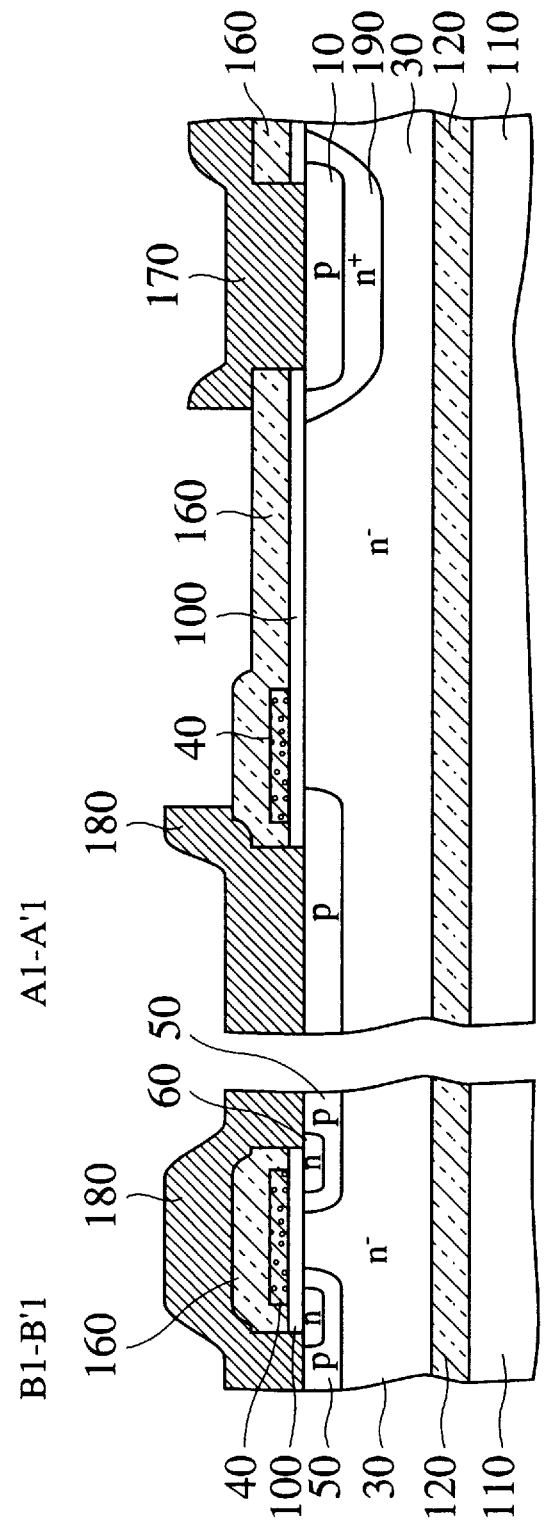

LATERAL INSULATED GATE BIPOLAR TRANSISTOR

BACKGROUND OF THE INVENTION

1. Field of the Invention

The present invention relates to a lateral insulated gate bipolar transistor (lateral IGBT), and particularly, to the structure of a lateral IGBT that influences electron and hole paths in the IGBT.

2. Description of the Prior Art

FIG. 13 is a sectional view showing a lateral MOS gate bipolar transistor, which is hereinafter referred to as the lateral IGBT (insulated gate bipolar transistor) or simply as the IGBT.

The IGBT of FIG. 13 is of an N-channel type and is formed on the primary surface of an N-type epitaxial layer 530. The epitaxial layer 530 contains a low concentration of diffused impurities and is formed on a silicon (Si) monocrystalline substrate. A P-type base region 550 with diffused P-type impurities is formed at the principal surface of the epitaxial layer 530. An N-type emitter region 560 containing a high concentration of diffused N-type impurities is formed at a part of the surface of the base region 550.

A gate oxide film 600 and a gate electrode 540 are formed one upon another to cover a part of the exposed surface of the emitter region 560, a part of the exposed surface of the epitaxial layer 530, and a part of the exposed surface of the base region 550 between these parts of the emitter region 560 and epitaxial layer 530. The base region 550 and emitter region 560 are electrically connected to an emitter electrode E. The gate electrode 540 is connected to a gate electrode G. When a positive voltage exceeding a threshold voltage Vth is applied to the gate electrode G with respect to the emitter electrode E, an N-type inverted layer, i.e., an electron channel is formed under the gate electrode 540. The structure involving the gate electrode 540 and the periphery thereof resembles the structure of a MOSFET (metal oxide semiconductor field effect transistor).

A P-type collector region 510 containing diffused P-type impurities is formed at the primary surface of the epitaxial layer 530 at a predetermined distance away from the base region 550. The collector region 510 is electrically connected to a collector electrode C. The P-type collector region 510, N-type epitaxial layer 530, and P-type base region 550 form a PNP bipolar transistor.

FIG. 14A shows an equivalent circuit of a standard IGBT that is a composite of a PNP bipolar transistor and a MOSFET. A source terminal of the MOSFET is connected to a collector terminal of the PNP transistor, and a drain terminal of the MOSFET is connected to a base terminal of the PNP transistor. Namely, the MOSFET controls a base current of the PNP transistor.

FIG. 15A is a plan view showing the gate electrode 540 and collector region 510 of the IGBT of FIG. 13. A dot-and-dash line A0–A'0 shown in FIG. 15A is the line along which the cross-sectional view of FIG. 13 has been taken.

The collector region 510 has a band shape with round upper and lower ends. The gate electrode 540 has a loop shape to surround the collector region 510 with a predetermined gap between them.

FIG. 15B is an enlarged view showing a part around the dot-and-dash line A0–A'0 of FIG. 15A. The collector region 510 at the right of FIG. 15B is spaced apart from the gate electrode 540 by the predetermined gap. The gate electrode 540 partly overlaps the base region 550 and emitter region 560 that are present below the gate electrode 540. Dotted lines 550a and 560a running in parallel with the gate electrode 540 indicate the boundaries of the base region 550 and emitter region 560.

When locally viewed, the collector region 510, gate electrode 540, base region 550, and emitter region 560 have each a band shape and are arranged in parallel with one another.

A first problem of the conventional IGBT will be explained.

In FIG. 15B, a continuous line 590 represents a path for passing holes serving as first carriers, and a continuous line 580 represents a path for passing electrons serving as second carriers. In practice, these paths are not linear but planar. Namely, electrons flow orthogonally to the long axis of the gate electrode 540 from the emitter region 560 toward the collector region 510, and holes flow vertical to the long axis of the gate electrode 540 from the collector region 510 toward the emitter region 560. These electron and hole paths overlap each other and their directions oppose to each other.

The electron and hole paths and the operation of the conventional IGBT will be explained with reference to FIG. 13. The electron and hole paths are mainly formed at a shallow part of the principal surface of the IGBT.

When a specified voltage is applied to the gate electrode 540, the MOSFET turns on to form an inverted layer, i.e., a channel at the surface of the base region 550 just under the gate electrode 540. Majority carriers, i.e., electrons (e) from the emitter region 560 pass through the channel, enter the epitaxial layer 530, move along the surface of the epitaxial layer 530, and reach the collector region 510, as indicated with a continuous line 580.

On the other hand, holes (h) from the collector region 510 move along the surface of the epitaxial layer 530, enter the base region 550, and reach the emitter electrode E, as indicated with a continuous line 590. At this time, a part of the surface of the base region 550 proximal to the collector region 510 involves the electron channel and emitter region 560, and therefore, the holes must pass under the electron channel and emitter region 560 to reach the emitter electrode E.

Here, the N-type emitter region 560, P-type base region 550, and N-type epitaxial layer 530 form a parasitic NPN bipolar transistor.

The base region 550 where holes pass through has a resistivity that is dependent on the concentration of P-type impurities thereof. When holes pass through the base region 550, they produce resistance R that is proportional to a distance the holes move. The resistance R multiplied by a current that is dependent on the quantity of the holes causes a voltage drop Vt, which is applied to the base and emitter terminals of the parasitic NPN transistor. As the distance for which the holes move in the base region 550 increases, the resistance R increases to increase the voltage drop Vt.

FIG. 14B shows an equivalent circuit of the IGBT including the parasitic NPN bipolar transistor, which is encircled with a dotted line. The parasitic NPN transistor has an emitter terminal connected to the source terminal of the MOSFET, a base terminal connected to the collector terminal of the PNP transistor, and a collector terminal connected to the drain terminal of the MOSFET as well as to the base terminal of the PNP transistor.

If the voltage drop Vt due to the resistance R exceeds a specific value, the parasitic NPN transistor turns on to pass a base current of the PNP transistor. As a result, a current continuously flows through the IGBT irrespective of the gate potential of the MOSFET, to cause a conduction called "latch-up". The latch-up disables the MOSFET to control a current passing through the PNP transistor, to thereby break down the IGBT.

Although the IGBT in the above explanation is of an n channel, the same explanation is applicable to a P-channel IGBT whose regional polarities are opposite to those of the N-channel IGBT. The P-channel IGBT also has the problem of the latch-up.

A second problem of the conventional IGBT will be explained.

The IGBT may be used as a power switching element of a motor. In this case, to reduce power consumption, a saturation voltage Vce between the collector and emitter of the IGBT for providing a specified collector current Ic must be as small as possible.

The saturation voltage Vce is dependent on a resistance value in the epitaxial layer 530 serving as a carrier drift region, and this resistance value is dependent on the concentration of total carriers.

In FIG. 13, the P-type collector region 510 is at the surface of the N-type epitaxial layer 530. This arrangement forms a hole accumulation layer CO around the collector region 510 due to a PN junction at there.

The accumulation layer CO increases the hole concentration of the drift region. To electrically compensate this, the electron concentration of the drift region increases, to thereby increase the concentration of total carriers in the drift region. As a result, the apparent total carrier concentration becomes higher than the impurity concentration of the epitaxial layer 530, and therefore, the resistance of the drift region becomes lower than the resistance of the epitaxial layer 530.

Namely, the carrier accumulation layer CO in the drift region helps reduce the saturation voltage Vce of the IGBT and provides the IGBT with an advantage of low power consumption, compared with a MOSFET, etc., having no carrier accumulation layer. It is necessary, however, to further reduce the power consumption of IGBTs.

SUMMARY OF THE INVENTION

An object of the present invention is to provide a lateral IGBT having a novel structure to prevent the latch-up.

Another object of the present invention is to provide a lateral IGBT having a novel structure to reduce a saturation voltage.

In order to accomplish the objects, a first aspect of the present invention provides a lateral IGBT having a first semiconductor layer of a first conductivity type, a base region of a second conductivity type formed at the surface of the first semiconductor layer, an emitter region of the first conductivity type formed at a part of the surface of the base region, a gate insulation film to partly cover the exposed surfaces of the emitter region, base region, and first semiconductor layer, a gate electrode formed on the gate insulation film, to cover the same area as the gate insulation film, a collector region of the second conductivity type formed at the surface of the first semiconductor layer independently of the base region, an emitter electrode electrically connected to the emitter region and base region, and a collector electrode electrically connected to the collector region. The emitter region is displaced from a main path for passing carriers from the collector region to the base region through the first semiconductor layer.

According to the first aspect, the main path of carriers runs through the base region without interfering with the emitter region. Accordingly, a voltage drop produced by the carriers due to the resistance of the base region and the moving distance of the carriers in the base region never acts between the emitter electrode and the first semiconductor layer. This suppresses the operation of a parasitic transistor formed with the emitter region, base region, and first semiconductor layer, thereby preventing the latch-up.

A second aspect of the present invention provides a lateral IGBT having a first semiconductor layer of a first conductivity type, a base region of a second conductivity type formed at the surface of the first semiconductor layer, an emitter region of the first conductivity type formed at a part of the surface of the base region, a gate insulation film to partly cover the exposed surfaces of the emitter region, base region, and first semiconductor layer, a gate electrode formed on the gate insulation film, to cover the same area as the gate insulation film, a collector region of the second conductivity type formed at the surface of the first semiconductor layer independently of the base region, an emitter electrode electrically connected to the emitter region and base region, and a collector electrode electrically connected to the collector region. A boundary of the base region facing the collector region has regular repeated convex-concave shape in a plan view. The emitter region is displaced from a shortest straight path connecting the collector region and the base region.

According to the second aspect, the boundary of the base region facing the collector region has regular repeated convex-concave shape so that the distance between the collector region and the base region changes regularly depending on locations. Carriers flowing from the collector region toward the base region through the first semiconductor layer move through a shortest path between the collector region and the base region. Since the emitter region is displaced from the shortest path, the emitter region never interferes with the carrier path. This suppresses the operation of a parasitic transistor composed of the emitter region, base region, and first semiconductor layer, thereby preventing the latch-up.

A third aspect of the present invention provides a lateral IGBT having a first semiconductor layer of a first conductivity type, a base region of a second conductivity type formed at the surface of the first semiconductor layer, an emitter region of the first conductivity type formed at a part of the surface of the base region, a gate insulation film to partly cover the exposed surfaces of the emitter region, base region, and first semiconductor layer, a gate electrode formed on the gate insulation film, to cover the same area as the gate insulation film, a collector region of the second conductivity type formed at the surface of the first semiconductor layer independently of the base region, an emitter electrode electrically connected to the emitter region and base region, and a collector electrode electrically connected to the collector region. In a plan view, the gate electrode is loop to surround the collector region with a predetermined gap between them. The base region and emitter region are formed by an ion implantation technique in a self-aligning manner with the gate electrode serving as a mask. An outer boundary of the gate electrode has regular repeated convex-concave shape in a plan view. The emitter region is displaced from a shortest straight path connecting the outer boundary of the gate electrode and the collector region.

According to the third aspect, the gate electrode is used as a mask when forming the base region and emitter region in a self-aligning manner according to an ion implantation technique. As a result, the shapes of the base region and emitter region are dependent on a plan shape of the gate electrode. Namely, the shape of a boundary of the base region in the vicinity of the collector region has regular repeated convex-concave shape in a plan view like the gate electrode.

The shortest straight path connecting the outer boundary of the gate electrode and the collector region is substantially equal to a shortest path between the collector region and the base region and serves as a main path for passing carriers from the collector region to the base region through the first semiconductor layer. Displacing the emitter region from the shortest straight path suppresses the operation of a parasitic transistor composed of the emitter region, base region, and first semiconductor layer, thereby preventing the latch-up.

A fourth aspect of the present invention adds some characteristics to the lateral IGBT of the third aspect. Namely, the gate electrode is provided with a comb shape in a plan view with the outer boundary thereof defining teeth of the comb. The base region is provided with, in a plan view, a boundary that extends inside and analogous to the outer boundary of the gate electrode. The emitter region is provided with, in a plan view, a rectangular shape and is formed under each side edge of each tooth of the gate electrode.

According to the fourth aspect, a shortest path between the base region and the collector region extends from a part of the base region formed under a spine between adjacent teeth of the gate electrode to the collector region. This shortest path serves as a main path for carriers, and no emitter region is present in the main path. This suppresses the operation of a parasitic transistor composed of the emitter region, base region, and first semiconductor layer, thereby preventing the latch-up.

A fifth aspect of the present invention adds some characteristics to the lateral IGBT of the fourth aspect. Namely, each tooth of the gate electrode is narrowed at the bottom thereof in a plan view, and the emitter region is formed under each side edge of a not-narrowed part of each tooth of the gate electrode.

According to the fifth aspect, the base of each tooth of the gate electrode is narrowed so that the base region is widened at a part away from the emitter region and in the vicinity of the collector region. As a result, carriers from the collector region are surely caught by the base region in front of the emitter region, to effectively prevent the latch-up.

A sixth aspect of the present invention adds some characteristics to the lateral IGBT of the third aspect. Namely, the outer boundary of the gate electrode is provided with a wave-shape in a plan view. The base region is provided with, in a plan view, a boundary that extends inside and analogous to the outer boundary of the gate electrode. The emitter region is provided with, in a plan view, a rectangular shape and is formed under each side edge of each crest of the outer boundary of the gate electrode.

According to the sixth aspect, the shapes of the base region and emitter region are dependent on the plan shape of the gate electrode. Accordingly, a shortest path between the base region and the collector region extends from a part of the base region under a valley of the wave-shape gate electrode to the collector region. This shortest path serves as a main path for carriers, and no emitter region is present in the main path. This suppresses the operation of a parasitic transistor composed of the emitter region, base region, and first semiconductor layer, thereby preventing the latch-up.

A seventh aspect of the present invention provides a lateral IGBT having a first semiconductor layer of a first conductivity type, a base region of a second conductivity type formed at the surface of the first semiconductor layer, an emitter region of the first conductivity type formed at a part of the surface of the base region, a gate insulation film to partly cover the exposed surfaces of the emitter region, base region, and first semiconductor layer, a gate electrode formed on the gate insulation film, to cover the same area as the gate insulation film, a collector region of the second conductivity type formed at the surface of the first semiconductor layer independently of the base region, an emitter electrode electrically connected to the emitter region and base region, and a collector electrode electrically connected to the collector region. The collector region is at the center of the IGBT in a plan view. The gate electrode is loop to surround the collector region with a predetermined gap between them. The gate electrode has a band shape in a plan view with a row of rectangular openings being formed along the length of and in the gate electrode at regular intervals. The base region and emitter region are formed in a self-aligning manner by implanting ions into each of the openings with the gate electrode serving as a mask. The base region is formed by implanting ions into the whole of each of the openings. The emitter region is formed at each of the openings except a part of the opening proximal to the collector region.

According to the seventh aspect, carriers from the collector region pass through the first semiconductor layer and flow into the base region in front of the emitter region. Namely, no emitter region is present in the carrier path. This suppresses the operation of a parasitic transistor composed of the emitter region, base region, and first semiconductor layer, thereby preventing the latch-up.

An eighth aspect of the present invention adds some characteristics to the lateral IGBT of any one of the preceding aspects. Namely, the first semiconductor layer is surrounded with a dielectric layer.

The eight aspect is capable of reducing the parasitic capacitance of wiring.

A ninth aspect of the present invention provides a lateral IGBT having a first semiconductor layer of a first conductivity type, a base region of a second conductivity type formed at the surface of the first semiconductor layer, an emitter region of the first conductivity type formed at a part of the surface of the base region, a gate insulation film to partly cover the exposed surfaces of the emitter region, base region, and first semiconductor layer, a gate electrode formed on the gate insulation film, to cover the same area as the gate insulation film, a collector region of the second conductivity type formed at the surface of the first semiconductor layer independently of the base region, an emitter electrode electrically connected to the emitter region and base region, and a collector electrode electrically connected to the collector region. The width LG of the gate electrode of covering a main path formed in the first semiconductor layer for passing carriers from the collector region to the base region is in the range of three times greater than the length Lc of a channel formed under the gate electrode for passing carriers of the other type.

The ninth aspect forms an electron accumulation layer of low resistance at the surface of the first semiconductor layer under the gate electrode adjacent to the base region. The electron accumulation layer decreases an electric field gradient between the base region and an end of the gate electrode and restricts the drifting speed of holes. The restricted holes remain at the end of the gate electrode and form a hole accumulation layer. The hole accumulation layer increases the total number of carriers in the first semiconductor layer serving as a carrier drift region and reduces a saturation voltage between the collector region and the emitter region.

BRIEF DESCRIPTION OF THE DRAWINGS

FIGS. 2A to 2C are sectional views showing a part of the IGBT of the first embodiment;

FIGS. 3A to 3E are sectional views showing a sequence of manufacturing the IGBT of the first embodiment;

DETAILED DESCRIPTION OF THE EMBODIMENTS (First embodiment)

Lateral IGBTs according to the first embodiment of the present invention will be explained with reference to FIGS. 1A to 4B.

Figure 1A:
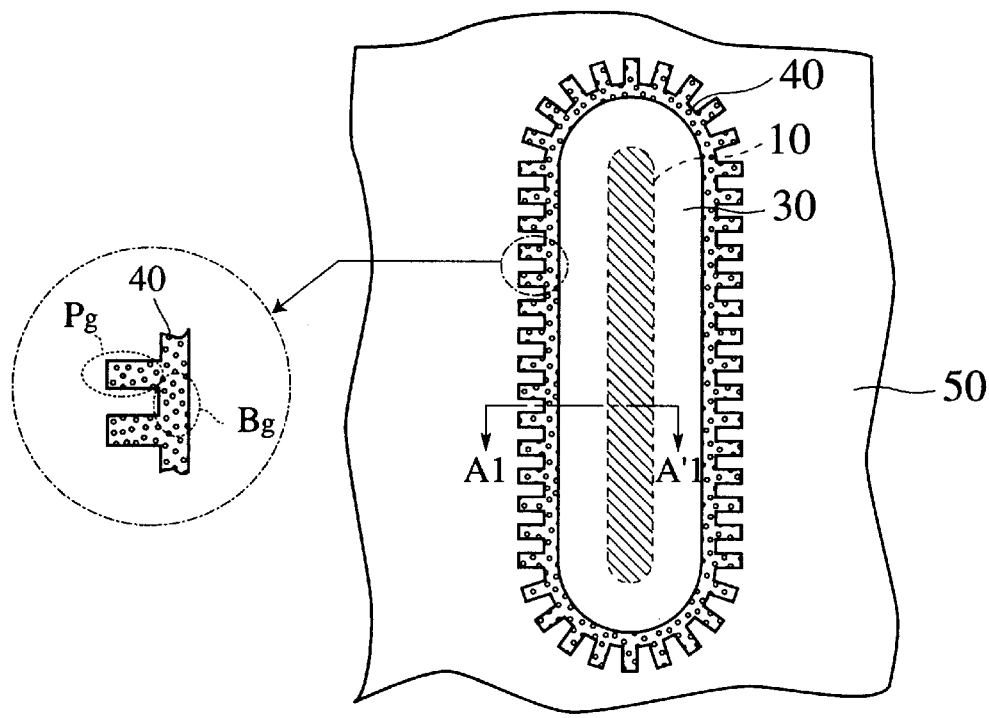
FIG. 1A and 1B are plan views showing an IGBT according to a first embodiment of the present invention.

FIG. 1A is a plan view showing a lateral IGBT according to the first embodiment. This figure shows only a collector region 10 and a gate electrode 40 of the IGBT. An N-type emitter region, a P-type base region, an emitter electrode, and a collector electrode of the IGBT are not shown in the figure. Plan views of the following embodiments are similarly made up.

The IGBT is formed at the surface of an N-type epitaxial layer that is formed on an insulation film formed on a silicon substrate. The collector region 10 has a band shape and is arranged at the center of the IGBT. The gate electrode 40 is loop area to surround the collector region 10 with a predetermined gap between them. According to the first embodiment, the gate electrode 40 has a comb shape. An encircled enlarged view at the left of FIG. 1A shows a part of the gate electrode 40 made of teeth Pg and a spine Bg extending between the adjacent teeth.

Figure 1B:
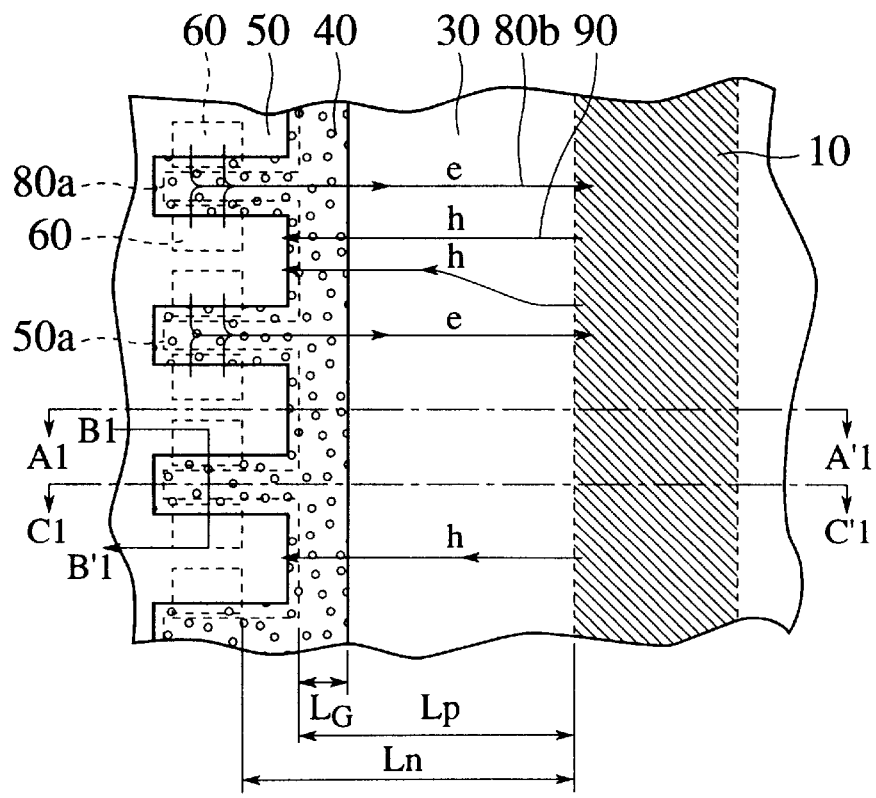

FIG. 1B is an enlarged view showing a part around a dot-and-dash line A1–A'1 shown in FIG. 1A. The collector region 10 is at the right of the figure, and the gate electrode 40 is at the left thereof. Each tooth Pg of the gate electrode 40 is on the outer side of the gate electrode 40. An inner boundary of the gate electrode 40 is on the right side of the gate electrode 40 and linearly runs in parallel with the collector region 10.

A dotted line 50a running slightly inside the comb contour of the gate electrode 40 indicates a boundary of the P-type base region 50. The base region 50 spreads on the left side, i.e., outer side of the dotted line 50a.

A pair of the N-type emitter regions 60 each having a rectangular shape are formed under side edges of each tooth Pg of the gate electrode 40. Each emitter region 60 is slightly on the outer side from the base of each tooth of the gate electrode 40. Accordingly, the emitter regions 60 are farther (more to the left side) from the collector region 10 than the boundary of the base region 50 under the spine Bg of the gate electrode 40.

In FIG. 1B, a channel of a MOSFET is formed at the surface of the base region 50 under each tooth Pg of the gate electrode 40 between the emitter region 60 and the epitaxial layer 30.

Namely, electrons (e) pass through paths 80a and 80b. The electron path 80a indicates the channel extending from each emitter region 60 under each side edge of each tooth Pg of the gate electrode 40. The electron path 80b extends through the epitaxial layer 30 under the center line of each tooth Pg of the gate electrode 40 and reaches the collector region 10 through the surface of the epitaxial layer 30. As a result, electrons from the emitter regions 60 pass through the channels orthogonal to the teeth Pg and then turn their directions in parallel with the teeth Pg.

A path for holes (h) is as indicated with a continuous line 90. Generally, carriers pass through a path of minimum resistance. Accordingly, holes from the collector region 10 pass through the epitaxial layer 30 and flow into the base region 50 in the vicinity of the collector region 10. Namely, most of holes from the collector region 10 flow into the base region 50 under the spine Bg of the gate electrode 40.

In a plan view, most of electrons pass through the paths 80a and 80b that extend under each tooth Pg of the gate electrode 40 and at the surface of the epitaxial layer 30 along an extension from each tooth Pg. On the other hand, most of holes pass through the shortest path 90 running under the spine Bg and connecting the base region 50 and the collector region 10. Namely, the electron and hole paths are separated from each other in a plan view. Unlike the prior art, no emitter region 60 is present in the hole path.

The electron and hole paths will be explained in detail with reference to FIGS. 2A to 2C.

FIG. 2A is a sectional view taken along the dot-and-dash line A1–A'1 of FIG. 1B, FIG. 2B is a sectional view taken along a dot-and-dash line B1–B'1 of FIG. 1B, and FIG. 2C is a sectional view taken along a dot-and-dash line C1–C'1 of FIG. 1B.

In the cross section of FIG. 2A passing between the adjacent teeth Pg of the gate electrode 40, holes (h) from the collector region 10 pass through the surface of the epitaxial layer 30, enter the base region 50, and reach the emitter electrode E. Since no emitter region 60 is in the hole path, there is no parasitic NPN transistor in this cross section.

In the cross section of FIG. 2B across the tooth Pg of the gate electrode 40, the base region 50 is under the edges of the tooth Pg, and the emitter regions 60 are formed at the surface of the base region 50. A gate insulation film 100 partly covers both the emitter regions 60. The gate electrode 40 is formed on the gate insulation film 100.

Electron channels are formed at the surface of the base region 50 under the tooth Pg. Electrons pass through the channels and enter the epitaxial layer 30 under the tooth Pg. There are substantially no holes that flow around the cross section of FIG. 2B, and therefore, a parasitic NPN transistor composed of the N-type emitter region 60, P-type base region 50, and N-type epitaxial layer 30 will not operate.

In the cross section of FIG. 2C along the center of the tooth Pg of the gate electrode 40, the base region 50 is under the tip of the tooth Pg. Electrons pass through the channels under the tooth Pg and enter the epitaxial layer 30. Thereafter, the electrons move along the primary surface of the epitaxial layer 30 and reach the collector region 10. In this cross section, no emitter region 60 is present, and therefore, there is no parasitic NPN transistor. In addition, there is substantially no hole path.

In this way, each emitter region 60 of the IGBT of the first embodiment is displaced from the hole path, and therefore, no parasitic NPN transistor operates and no latch-up occurs.

To suppress the latch-up more effectively, it is preferable to make the shortest distance Ln between the collector region 10 and the emitter region 60 longer than the shortest distance Lp between the base region 50 under the spine Bg and the collector region 10, to surely let holes flow into the base region 50 under the spine Bg of the gate electrode 40.

The shortest distance Lp is determined according to a designed breakdown voltage of the IGBT. If the breakdown voltage is 500 V, the distance Lp will be about 50 μm.

According to the inventor's experiments, the IGBT of the first embodiment sufficiently suppresses the latch-up with the distance Lp being 50 μm and the distance Ln being 55 μm. In this case, the length of each tooth Pg of the gate electrode 40 was 11 μm, and the pitches of the teeth Pg were 14 μm.

The IGBT of the first embodiment is manufacturable by standard lateral-IGBT manufacturing process. This process will briefly be explained with reference to FIGS. 3A to 3E. An SOI (silicon on insulator) substrate is used. In each of FIGS. 3A to 3E, the right side shows a sectional view taken along the dot-and-dash line A1–A'1 of FIG. 1B and the left side shows a sectional view taken along the dot-and-dash line B1–B'1 of FIG. 1B.

In FIG. 3A, the SOI substrate is made of a silicon monocrystalline substrate 110, an intermediate insulation film 120 formed on the substrate 110, and an N-type silicon epitaxial layer 30 formed on the insulation film 120. The insulation film 120 may be an $SiO_2$ layer of about 3 to 4 μm thick. The epitaxial layer 30 may be an N-type silicon layer doped with phosphorus (P) of about $5 \times 10^{14}/cm^3$. The silicon active layer 30 is hereinafter referred to as the N-type epitaxial layer 30, or simply as the epitaxial layer 30. The SOI substrate is manufactured according to, for example, a wafer direct bonding technique.

Usually, the surface of the epitaxial layer 30 is thermally oxidized to form a field oxide film. If a deep diffusion region is needed, the field oxide film is patterned and is used as a mask to implant ions into the substrate. The substrate is then annealed to form a diffusion layer. If required, the field oxide film is removed by etching, to expose the surface of the epitaxial layer 30. This will be explained later in detail.

The surface of the substrate is thermally oxidized to form a gate oxide film 100 of about 50 to 500 nm thick on the epitaxial layer 30. The gate oxide film 100 may be an SiO2 film or any other insulation film.

On the gate oxide film 100, a polycrystalline silicon film 40a of about 500 nm thick doped with phosphorus (P) is formed by LCVD (Low Pressure Chemical Vapor Deposition) method. Up to this stage, the A1–A'1 section and B1–B'1 section have the same structure.

In FIG. 3B, the silicon film 40a is patterned according to a standard photolithography method, to form the gate electrode 40. A resist film is formed on the gate electrode 40 and is patterned to provide a resist pattern 130.

The gate electrode 40 and resist pattern 130 are used as a mask, and boron (B) is implanted as P-type impurity ions into the surface of the substrate. The ion implantation is carried out with, for example, 40 to 50 keV in ion implantation energy and $10^{13}$ to $10^{14}/cm^2$ in dose.

Then, the substrate is annealed for 5 to 10 hours at about 1100° C., to simultaneously form the P-type base region 50 and P-type collector region 10 each having a diffusion depth of about 2 to 3 μm. Since the gate electrode 40 is used as an implantation mask, the shape of an inner boundary of the base region 50 is dependent on the shape of an outer boundary of the gate electrode 40. The resist pattern 130 remaining on the substrate is removed by etching.

In FIG. 3C, a resist pattern 140 is formed on the surface of the substrate. The resist pattern 140 and gate electrode 40 are used as a mask to implant arsenic (As) ions as P-type impurities into the surface of the substrate. The ion implantation is carried out with, for example, 30 to 40 keV in ion implantation energy and about $10^{15}/cm^2$ in dose. The substrate is annealed for about 10 to 20 minutes at about 900° C. to 1000° C. to form the N-type emitter region 60 having a diffusion depth of about 0.2 to 0.3 μm. The resist 140 is then removed.

In FIG. 3D, an interlayer insulation film 160 of 1.5 μm to 3 μm thick is formed on the surface of the substrate by CVD method. The insulation film 160 may be an SiO2 film, a BPSG (boron-phospho-silicate glass) film, or a lamination of them.

Contact holes are formed through the interlayer insulation film 160 on the collector region 10, base region 50, and emitter region 60 as shown in FIG. 3D. By the spattering, an aluminum (Al) film of about 1 to 4 μm thick is formed on the surface of the substrate to fill the contact holes. The aluminum film is patterned by a photolithography method to form a collector electrode 170 connected to the collector region 10, as well as an emitter electrode 180 connected to the base region 50 and emitter region 60.

Similar to the manufacturing of a standard IGBT, a passivation film is formed on the surface of the substrate, and if required, the substrate is cut into chips.

The manufacturing process mentioned above is applicable to the embodiments mentioned below.

In FIG. 3E, a high-concentration N-type diffusion layer 190 is formed around the collector region 10, so that holes are efficiently injected from the collector region 10 into the epitaxial layer 30.

In this case, before forming the gate oxide film 100 in FIG. 3A, a field oxide film is formed on the surface of the epitaxial layer 30 and is patterned. The patterned field oxide film is used as a mask to implant N-type impurity ions such as phosphorus ions into the substrate. Then, the substrate is annealed to form the high-concentration N-type impurity diffusion layer 190.

Figure 4A:
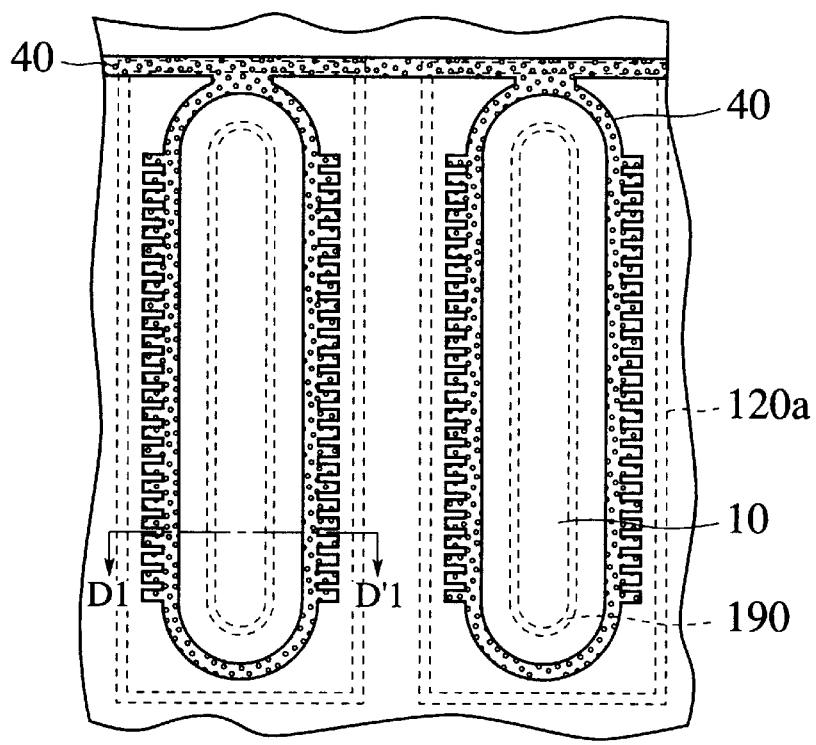
FIGS. 4A and 4B are plan views showing another IGBT according to the first embodiment.

FIG. 4A is a plan view showing another lateral IGBT according to the first embodiment. A gate electrode 40 of this IGBT partly has a comb shape, unlike the IGBT of FIG. 1A whose gate electrode 40 has entirely a comb shape. More precisely, the gate electrode 40 of FIG. 4A has comb teeth only at straight sections. Each unit cell of the IGBT is formed at each tooth of the gate electrode 40, and therefore, the number of teeth of the gate electrode 40 of FIG. 4A is adjusted according to a requirement.

To improve a current to flow, a plurality of IGBTs may be formed on a single chip. In FIG. 4A, two IGBTs are formed side by side on a chip, and a common lead electrode is extended from an end of each gate electrode 40 of the IGBTs.

Figure 4B:
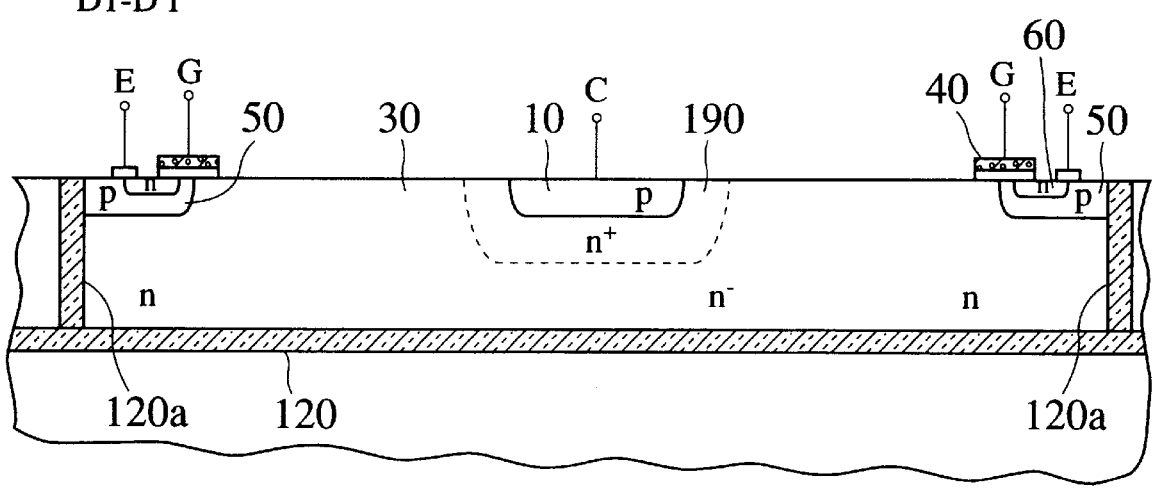

FIG. 4B is a sectional view taken along a dot-and-dash line D1–D'1 of FIG. 4A. FIG. 4B resembles FIG. 2B but covers a wider area.

A P-type collector region 10 is formed at the center of the surface of an N-type epitaxial layer 30. A high-concentration N-type impurity region 190 is formed around the collector region 10. A P-type base region 50 is formed at the surface of the epitaxial layer 30 on each side of the collector region 10. There is a space between the collector region 10 and each base region 50. An N-type emitter region 60 is formed at the surface of the base region 50. A gate oxide film is formed to partly cover the emitter region 60, base region 50, and epitaxial layer 30, and the gate electrode 40 is formed on the gate oxide film. The collector region 10 is electrically connected to a collector electrode C. The emitter region 60 and base region 50 are electrically connected to an emitter electrode E. The gate electrode 40 is connected to a lead gate electrode G.

A dielectric layer 120 made of, for example, SiO2 is formed at the bottom of the epitaxial layer 30. A dielectric layer 120a surrounds the epitaxial layer 30. The dielectric layer 120a is outside the emitter regions 60 and extends from the surface of the substrate to the dielectric layer 120, to reduce parasitic capacitance.

(Second embodiment)

A lateral IGBT according to the second embodiment of the present invention will be explained with reference to FIGS. 5A to 5C. A collector region 10 of band shape is formed at the center of the IGBT. A loop gate electrode 41 surrounds the collector region 10.

Figure 5A:
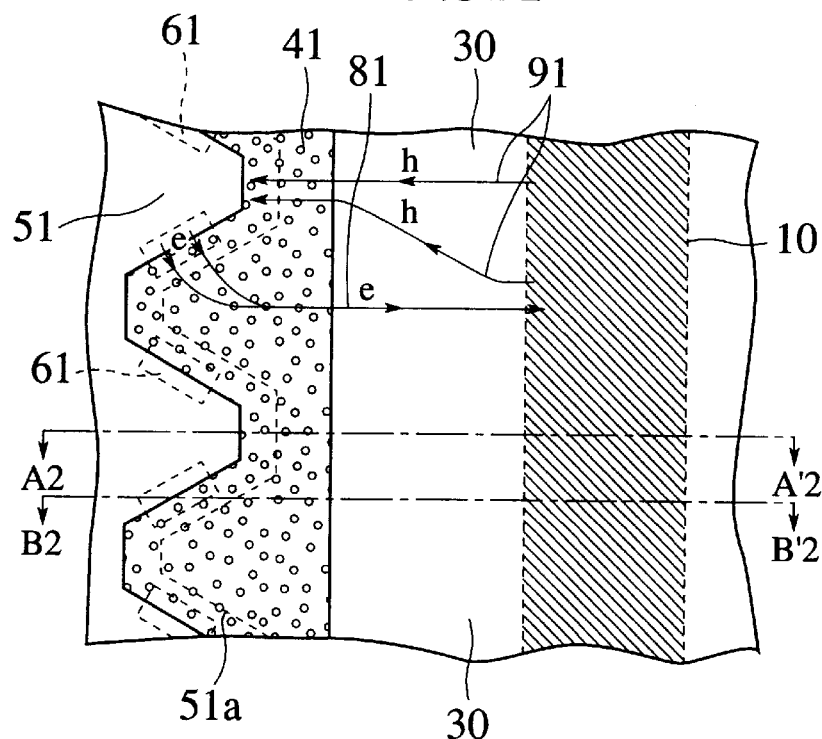
FIGS. 5A to 5C are plan and sectional views showing an IGBT according to a second embodiment of the present invention.

FIG. 5A is an enlarged plan view showing a part of the IGBT of the second embodiment. Unlike the gate electrode 40 of the first embodiment having a comb shape, the gate electrode 41 of the second embodiment has a wavy outer boundary with each tooth having a trapezoidal shape.

The gate electrode 41 is used as an ion implantation mask, to form a P-type base region 51 in a self-aligning manner. Accordingly, the shape of the base region 51 is dependent on the shape of the gate electrode 41. A dotted line 51a slightly inside the outer boundary of the gate electrode 41 defines an inner boundary of the base region 51.

A continuous line 81 indicates an electron path. Electrons from each N-type emitter region 61 enter a channel formed under the gate electrode 41, flow through an N-type epitaxial layer 30, and reach the collector region 10. Since the gate electrode 41 has the trapezoidal teeth, each electron channel is oblique to an inner boundary of the gate electrode 41, to smoothly pass electrons.

A continuous line 91 indicates a path for holes that are injected from the collector region 10 into the epitaxial layer 30. The holes flow into a part of the base region 51 nearest to the collector region 10. Namely, they flow into the base region 51 under the valleys of the wavy gate electrode 41. Similar to the first embodiment, no emitter region 61 is present in the hole path.

Figure 5B:
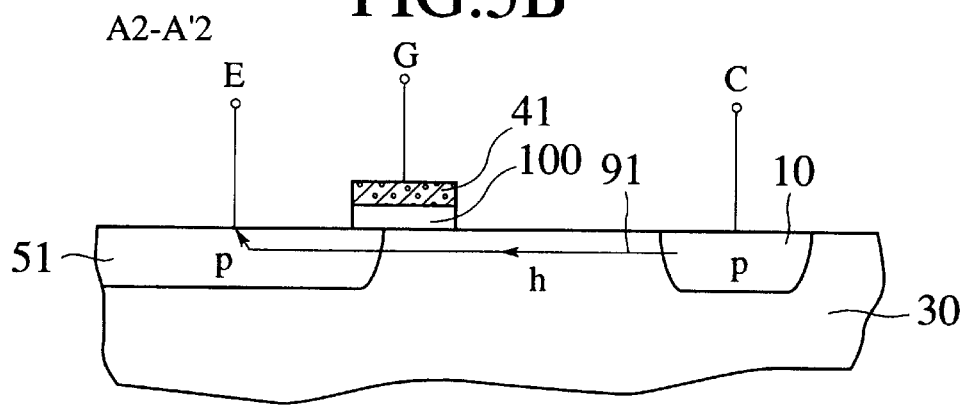
Figure 5C:
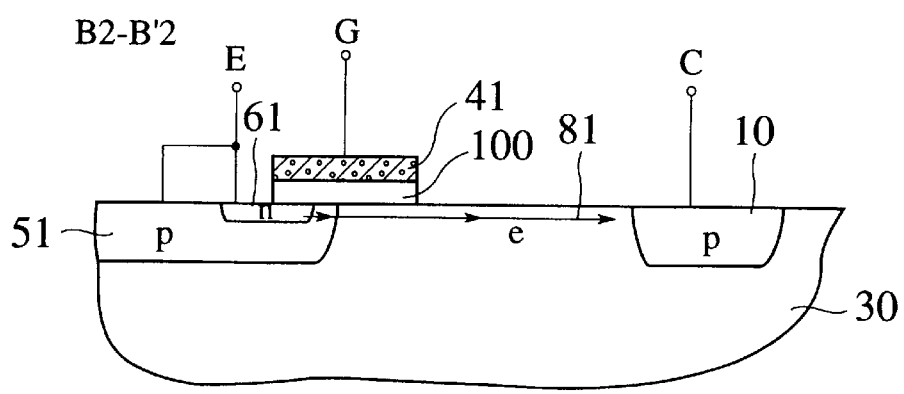

FIG. 5B is a sectional view taken along a dot-and-dash line A2–A'2 of FIG. 5A, and FIG. 5C is a sectional view taken along a dot-and-dash line B2–B'2 of FIG. 5A.

In the cross section of FIG. 5B passing through a valley of the gate electrode 41 orthogonally to the inner boundary of the gate electrode 41, there is the hole path 91. Since no emitter region 61 is present in the hole path 91, there is no parasitic NPN transistor in this cross section.

In the cross section of FIG. 5C passing through the emitter region 61 orthogonally to the inner boundary of the gate electrode 41, there is an electron path 81. There is no hole path under electron channel and the emitter region 61, and therefore, there is no parasitic NPN transistor that operates in this cross section.

In the second embodiment, the emitter regions 61 are displaced from hole paths, and therefore, no parasitic NPN transistor operates and no latch-up occurs.

(Third embodiment)

A lateral IGBT according to the third embodiment of the present invention will be explained with reference to FIGS. 6A to 6C. A collector region 10 of band shape is formed at the center of the IGBT, and a loop gate electrode 42 surrounds the collector region 10, similar to the first embodiment.

Figure 6A:
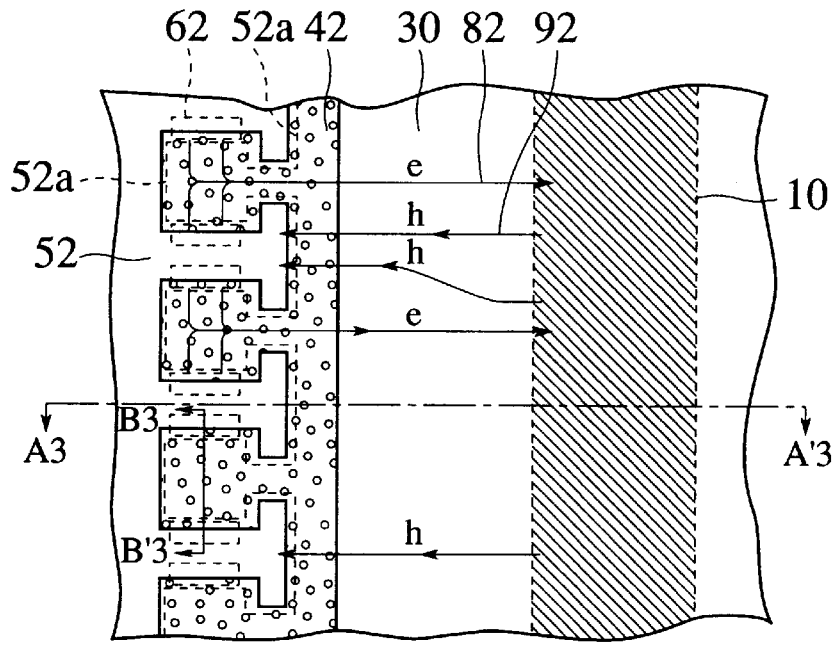
FIGS. 6A to 6C are plan and sectional views showing an IGBT according to a third embodiment of the present invention.

FIG. 6A is an enlarged plan view showing a part of the IGBT of the third embodiment. What is different from the first embodiment is that the gate electrode 42 of the third embodiment has teeth each of which has a narrowed bottom. A P-type base region 52 that is formed in a self-aligning manner with the use of the gate electrode 42 has an inner boundary that is analogous to an outer boundary of the gate electrode 42. A dotted line 52a slightly inside the outer boundary of the gate electrode 42 defines the inner boundary of the base region 52. An N-type emitter region 62 is formed under each side edge of a wider part of each tooth of the gate electrode 42.

An electron path 82 and a hole path 92 are similar to those of the first embodiment.

Since the bottom of each tooth of the gate electrode 42 is narrowed, the width of the base region 52 facing the collector region 10 widens in front of each emitter region 62, to surely pull holes into the base region 52 in front of the emitter regions 62.

Figure 6B:
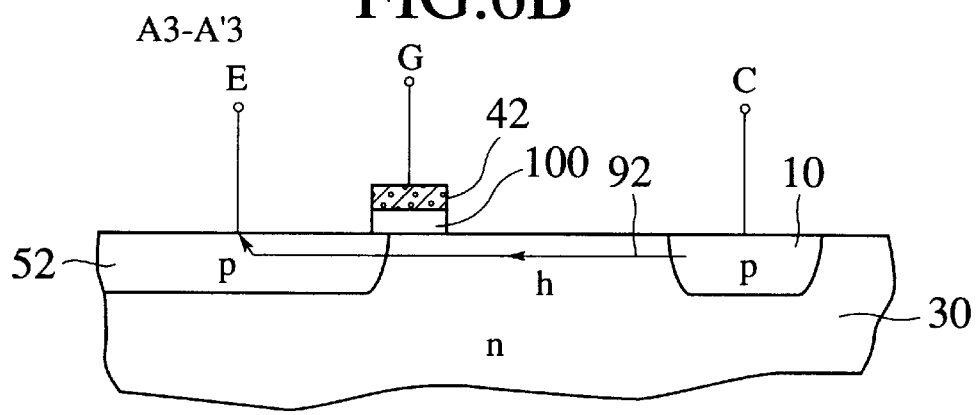
Figure 6C:
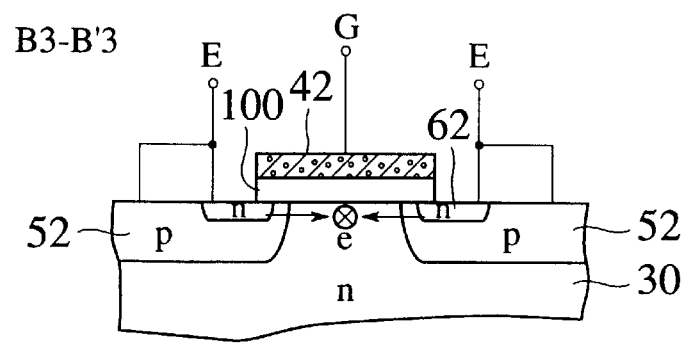

FIG. 6B is a sectional view taken along a dot-and-dash line A3–A'3 of FIG. 6A, and FIG. 6C is a sectional view taken along a dot-and-dash line B3–B'3 of FIG. 6A. Electron and hole paths in each cross section are substantially the same as those of the first embodiment.

In the cross section of FIG. 6B passing between the adjacent teeth of the gate electrode 42 orthogonally to an inner boundary of the gate electrode 42, the hole path 92 extends from the collector region 10 to the base region 52 through an N-type epitaxial layer 30. This path runs along the principal surface of the substrate, and no emitter region 62 is positioned on the path. Accordingly, there is no parasitic NPN transistor in this cross section.

The cross section of FIG. 6C cuts across each tooth of the gate electrode 42 where the emitter regions 62 are formed and runs in parallel with the inner boundary of the gate electrode 42. In this cross section, electrons from each emitter 62 pass through a channel under the tooth of the gate electrode 42, gather under the center line of the tooth, and flow toward the collector region 10. Namely, the electron path is formed mainly in this cross section. Unlike the prior art, there is no hole path under the electron channel and emitter regions 61, and therefore, there is no parasitic NPN transistor that operates.

(Fourth embodiment)

A lateral IGBT according to a fourth embodiment of the present invention will be explained with reference to FIGS. 7A to 8B. A collector region 10 of band shape is formed at the center of the IGBT, and a loop gate electrode 43 is formed around the collector region 10, similar to the first embodiment.

Figure 7A:
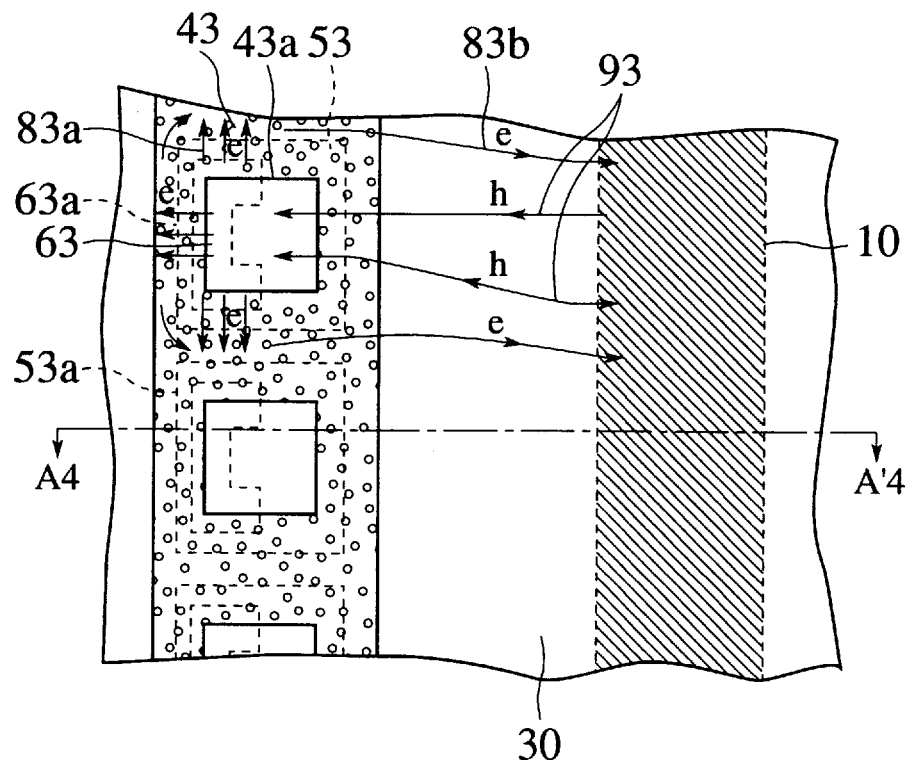
FIG. 7A and 7B are plan and sectional views showing an IGBT according to a fourth embodiment of the present invention.

FIG. 7A is an enlarged plan view showing a part of the IGBT of the fourth embodiment. The gate electrode 43 has rectangular openings 43a at regular intervals. A P-type base region 53 is formed around each opening 43a, as indicated with a dotted line 53a. An N-type emitter region 63 is formed in a concave shape inside the base region 53 on an outer side from the center of the opening 43a. Namely, the emitter region 63 is on the far side from the collector region 10.

Electrons from each emitter region 63 pass through channels 83a under the gate electrode 43 and reach an N-type epitaxial layer 30. Thereafter, the electrons flow through the epitaxial layer 30 around the base region 53 toward the collector region 10, as indicated with a continuous line 83b.

Holes from the collector region 10 move through the epitaxial layer 30 and go into a part of each base region 53 adjacent to the collector region 10, as indicated with a continuous line 93. Similar to the first to third embodiments, no emitter region 63 is positioned in the hole path 93. The electron path 83b is formed at the side of the hole path 93, so that the electron and hole paths are separated from each other in the plan view.

Figure 7B:
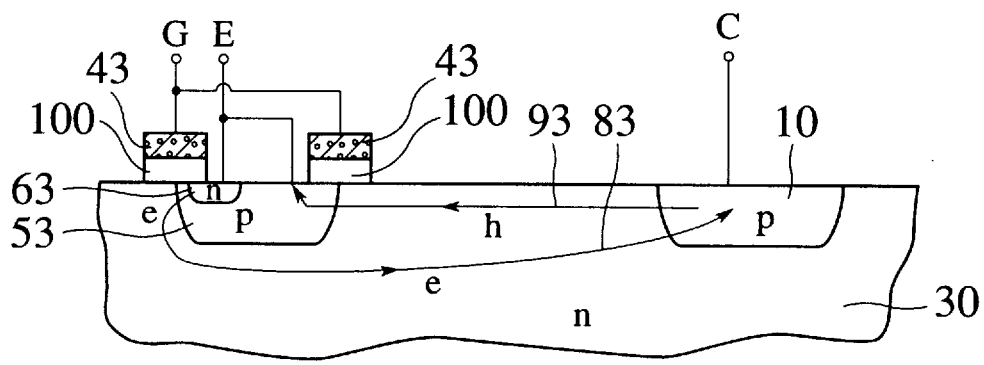

FIG. 7B is a sectional view taken along a dot-and-dash line A4–A'4 of FIG. 7A. In this cross section passing through the opening 43a orthogonally to an inner boundary of the gate electrode 43, an electron channel of a MOSFET is formed under the gate electrode 43 on the outer side from the center of the opening 43a. As indicated with a continuous line 83, electrons from the emitter 63 pass through the channel and enter the epitaxial layer 30 outside the emitter region 63. Thereafter, the electrons move under the base region 53 and reach the collector region 10. On the other hand, holes from the collector region 10 flow along the principal surface of the epitaxial layer 30 as indicated with a continuous line 93 and reach the base region 53.

Since the length of a path of holes in the base region 53 is short, a parasitic NPN transistor composed of the N-type emitter region 63, P-type base region 53, and N-type epitaxial layer 30 never operates.

In this embodiment, each concave emitter region 63 is on the outer side from the center of the rectangular opening 43a. The emitter region 63 may have a rectangular shape and may be formed around one side of the opening 43a farthest from the collector region 10. The concave emitter region 63, however, is advantageous in providing a wider electron channel, thereby reducing the resistance of the electron channel.

Figure 8A:
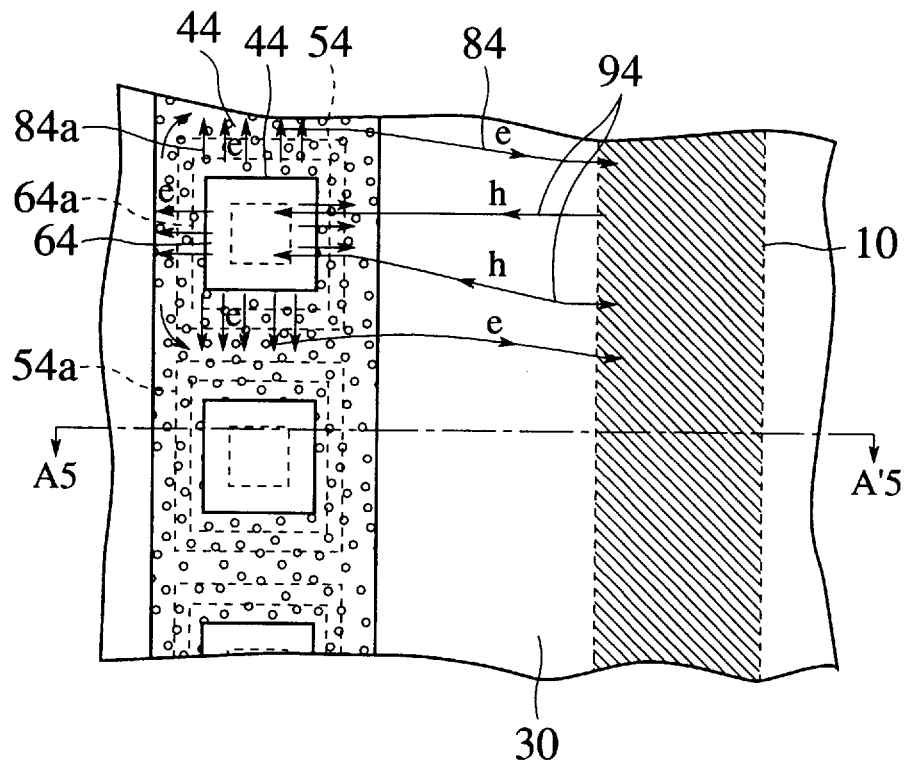
FIGS. 8A and 8B are plan and sectional views showing another IGBT according to the fourth embodiment.

FIG. 8A is a plan view showing another IGBT according to the fourth embodiment. This IGBT has a gate electrode 44 having the same shape as the gate electrode 43 of FIG. 7A. What is different from the IGBT of FIGS. 7A and 7B is that an N-type emitter region 64 of FIG. 8A has a frame shape at each rectangular opening of the gate electrode 44.

As a result, a frame-shape electron channel region is formed around each opening of the gate electrode 44. This results in widening the electron channel, reducing the resistance of the electron channel, and increasing a current to pass.

Figure 8B:
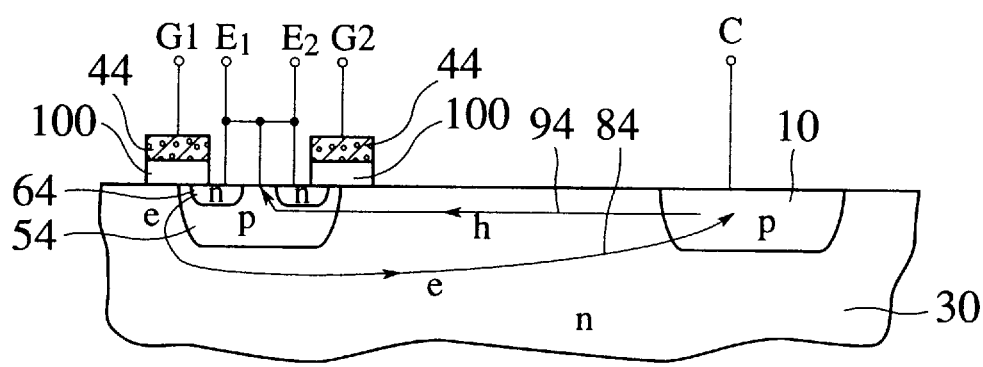

FIG. 8B is a sectional view taken along a dot-and-dash line A5–A'5 of FIG. 8A. Since the emitter region 64 has a frame shape, the emitter region 64 is also formed at an inner side of a P-type base region 54 proximal to a P-type collector region 10.

Holes from the collector region 10 flow along the primary surface of an N-type epitaxial layer 30 as indicated with a continuous line 94. Thereafter, the holes enter the base region 54, move under a front part of the emitter region 64, and reach an emitter electrode E2. In this case, there may be a possibility of causing the latch-up similar to the conventional IGBT. However, a MOSFET involving a rear part of the emitter region 64 has an effect of suppress occurring the latch-up like the IGBT of FIGS. 7A and 7B.

(Fifth embodiment)

A lateral IGBT according to the fifth embodiment of the present invention will be explained with reference to FIGS. 9A to 11. This IGBT provides not only an effect of suppressing the latch-up to occur but also an effect of dropping a saturation voltage Vce.

Figure 9A:
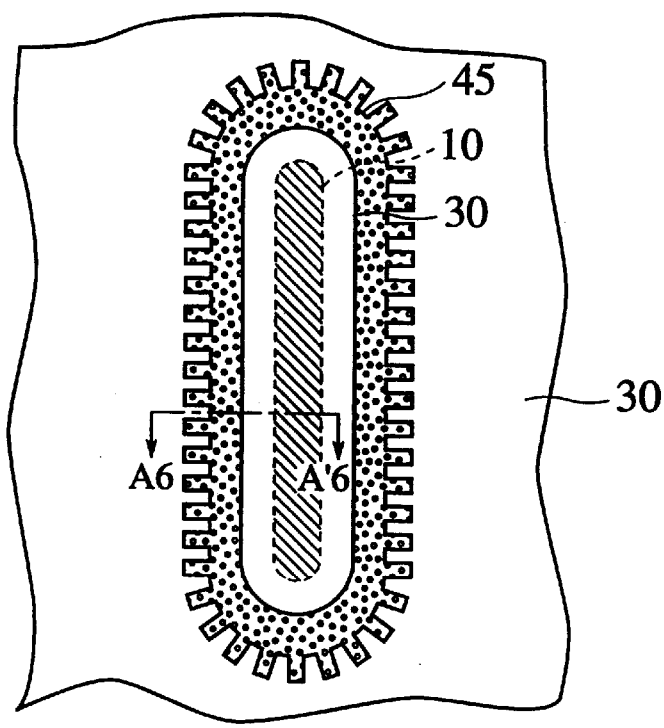
FIGS. 9A and 9B are plan views showing an IGBT according to a fifth embodiment of the present invention.
Figure 9B:
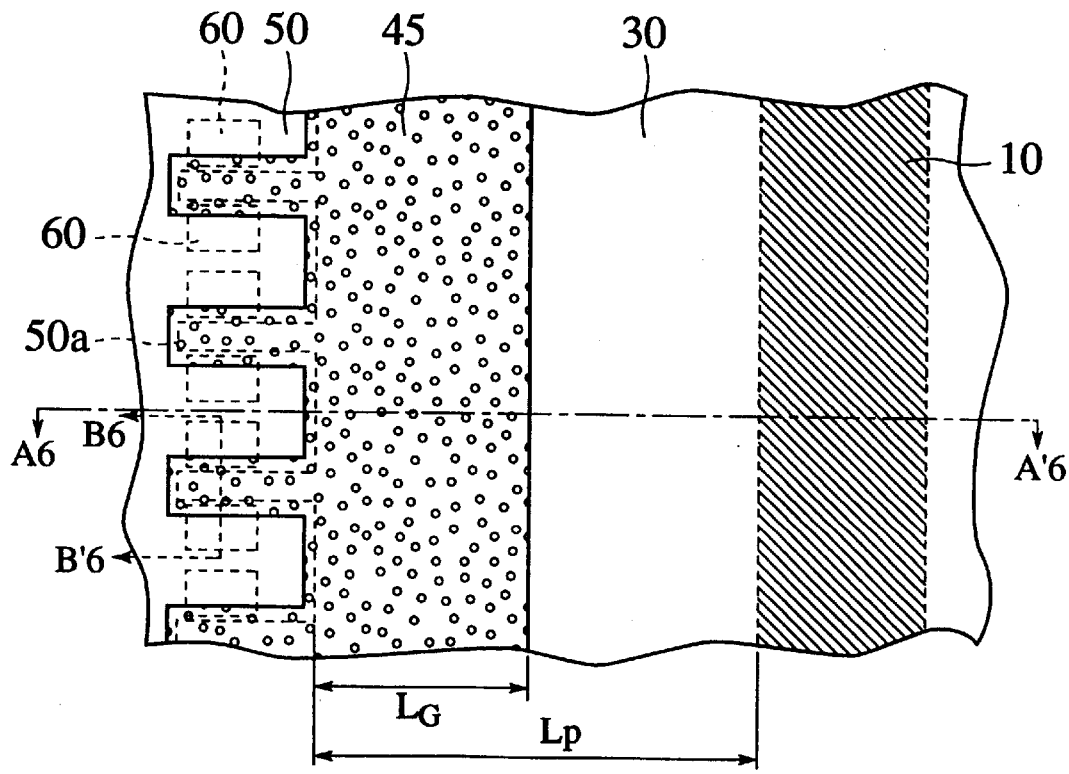

FIG. 9A is a plan view showing the IGBT, and FIG. 9B is an enlarged plan view showing a part around a dot-and-dash line A6–A'6 of FIG. 9A. The basic structure of this IGBT is the same as that of the first embodiment. Namely, a P-type collector region 10 of band shape is formed on a substrate, and a loop gate electrode 45 of comb shape is formed around the collector region 10 with a predetermined gap between them.

What is different from the first embodiment is that a distance LG between a boundary of a P-type base region 50 and an inner boundary of the gate electrode 45 at a spine Pg of the gate electrode 45 is wide. The gate electrode 45, therefore, broadly covers the surface of an N-type epitaxial layer 30.

Figure 10A:
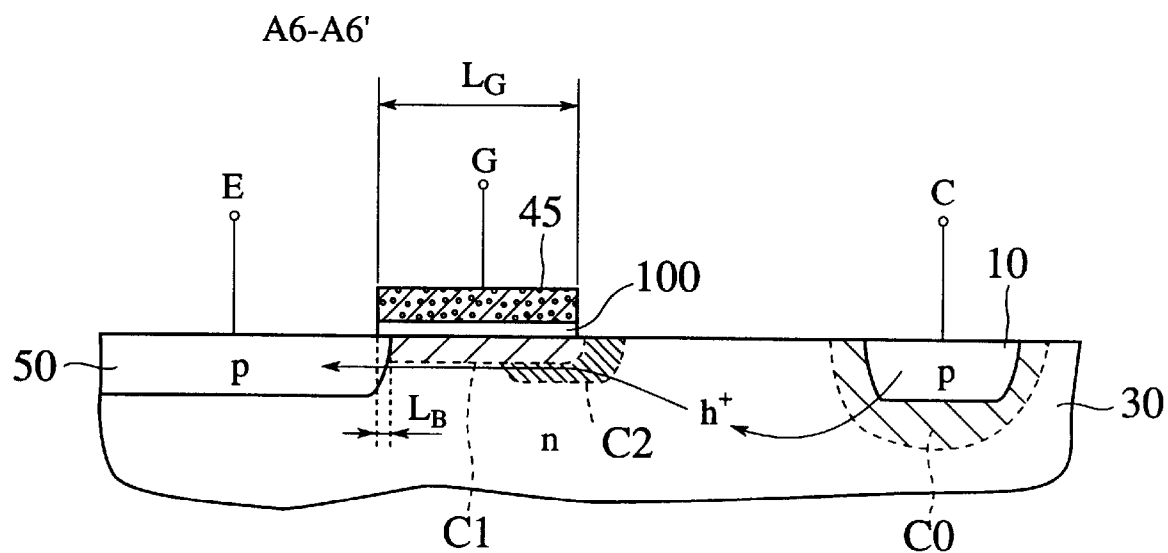
FIGS. 10A and 10B are sectional views showing the IGBT of the fifth embodiment.
Figure 10B:
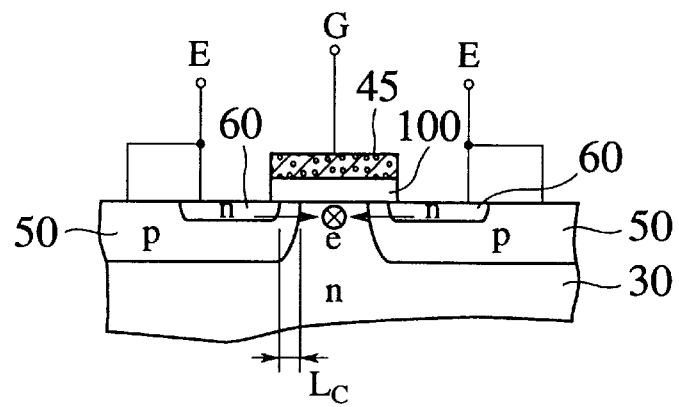

FIG. 10A is a sectional view taken along a dot-and-dash line A6–A'6 of FIG. 9B, and FIG. 10B is a sectional view taken along a dot-and-dash line B6–B'6 of FIG. 9B.

In FIG. 10A, holes from the collector region 10 pass through the surface of the epitaxial layer 30 and base region 50 and reach an emitter electrode E.

Since the surface of the epitaxial layer 30 is widely covered with the gate electrode 45 with a gate oxide film 100 interposing between them, carriers in the fifth embodiment move differently from the first embodiment.

The surface of the epitaxial layer 30 covered with the gate electrode 45 induces electrons to form an electron accumulation layer C1. This layer C1 has a low resistance value due to a high concentration of electrons, to greatly decrease a potential difference $\Delta V(LG)$ between a part just under an inner edge of the gate electrode 45 and the base region 50.

The drifting speed of holes is dependent on the strength of an electric field, and when the potential difference $\Delta V(LG)$ decreases, the drifting speed of holes slows down. This results in blocking a flow of holes just under the inner edge of the gate electrode 45, and therefore, the holes stay there to form a hole accumulation layer C2.

Eventually, the IGBT of the fifth embodiment involves not only a carrier accumulation layer C0 around the collector region 10 but also the carrier accumulation layer C2 adjacent to the gate electrode 45, to apparently increase the concentration of holes in the drift region. An increase in the hole concentration causes an increase in the concentration of electrons to cancel the holes, thereby increasing the concentration of total carriers in the drift region.

The increase in the total carrier concentration in the drift region reduces the resistance of the drift region, to drop a saturation voltage Vce between a collector electrode C and the emitter electrode E.

Figure 11:
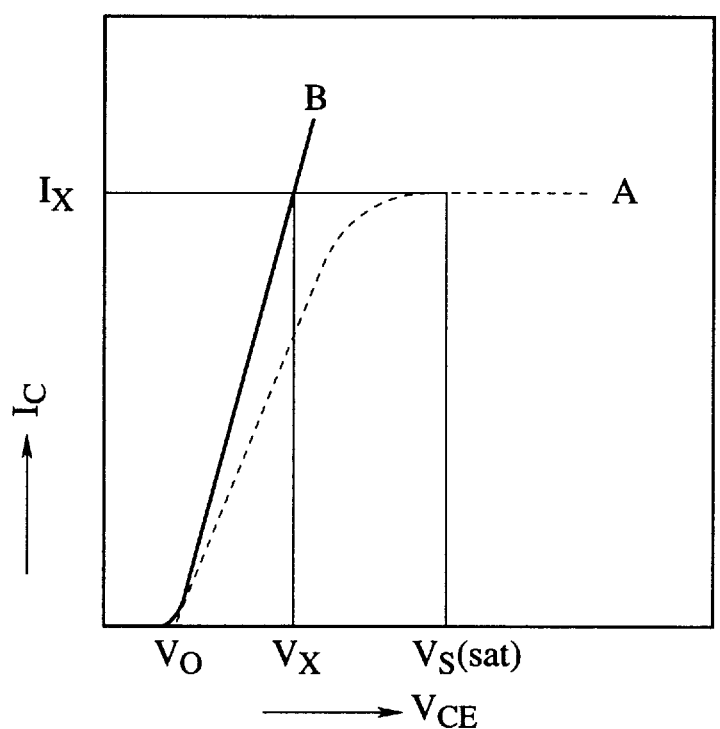
FIG. 11 is a graph showing the I–V characteristics of the IGBTs of the fifth embodiment and prior art.

FIG. 11 is a graph showing the I–V characteristics of the IGBTs of the fifth embodiment and prior art. An abscissa represents a voltage Vce between a collector electrode C and an emitter electrode E of the IGBTs, and an ordinate represents a collector current Ic. A dotted line A indicates the I–V characteristic of the conventional IGBT, and a continuous line B indicates that of the fifth embodiment. In the conventional IGBT, the current Ic starts to linearly rise when the voltage Vce exceeds about 0.6 V, and thereafter, the current Ic saturates. Here, the voltage between the collector electrode C and the emitter electrode E necessary to produce a specific value of the collector current Ic is called the saturation voltage.

For example, the conventional IGBT needs a saturation voltage of Vs to provide a specific current value of Ix. On the other hand, the IGBT of the fifth embodiment needs only a smaller saturation voltage of Vx to provide the same current value Ix. This is because the fifth embodiment involves lower resistance in the drift region to steeply raise the collector current Ic in response to an increase in the voltage Vce. If the IGBT of the fifth embodiment is used as a power switch, it will operate on a low voltage to reduce power consumption.

As the width of the drift region covered with the gate electrode is widened, the quantity of holes accumulated in the accumulation layer C2 increases to lower the saturation voltage. This, however, increases the area of the gate electrode on a chip, thereby enlarging the size of the chip. According to the fifth embodiment, it is preferable that the distance LG is in the range of more than three times as large as the length Lc of a MOSFET channel of FIG. 12(b). Or it is preferable that the distance LG is in the range of more than three times as large as the length LB, which is the length of the base region covered with the gate electrode.

The shape and size of the teeth of the gate electrode 45 may be the same as those of the first embodiment. The distance Lp is determined according to a designed breakdown voltage of the IGBT.

Figure 12A:
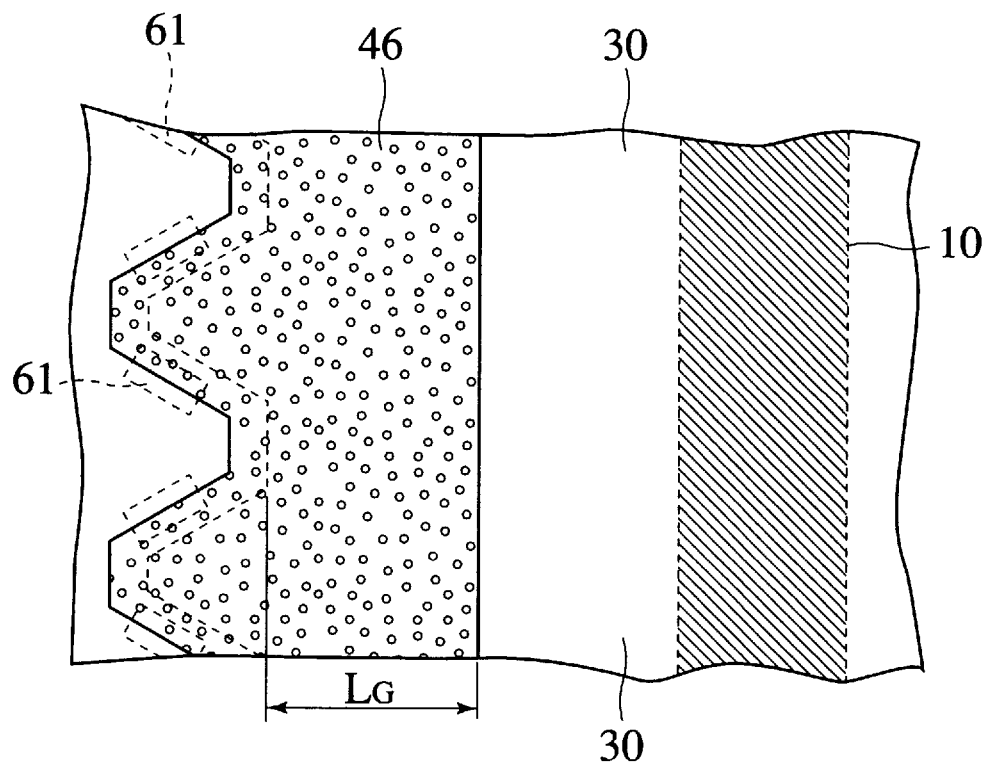
FIGS. 12A to 12D are plan views showing other IGBTs according to the fifth embodiment.
Figure 12B:
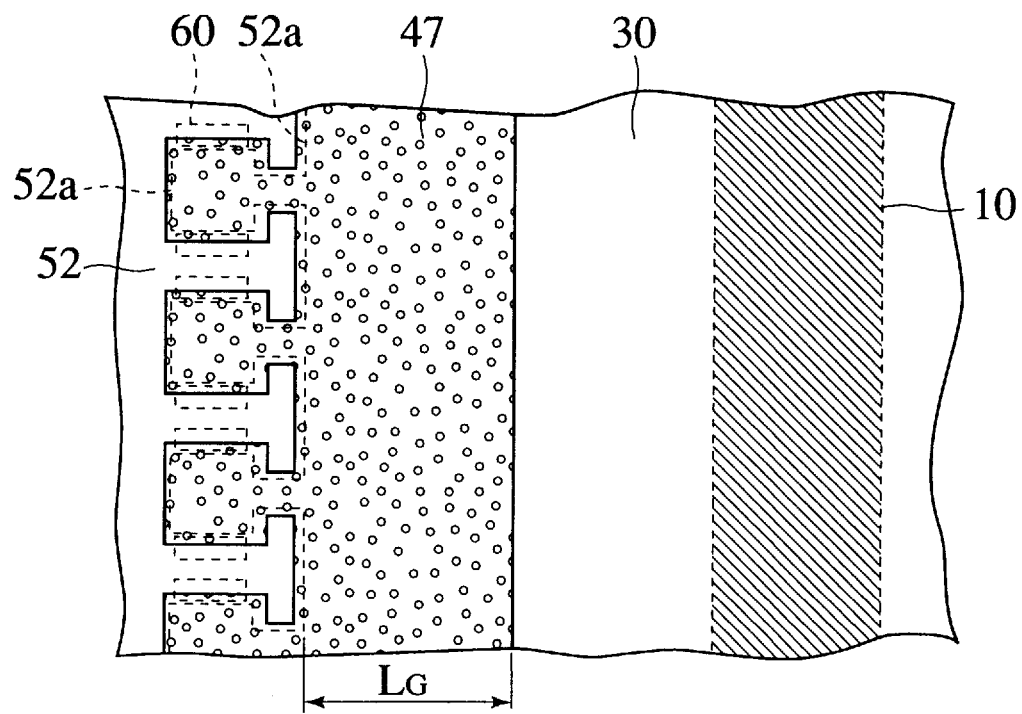
Figure 12C:
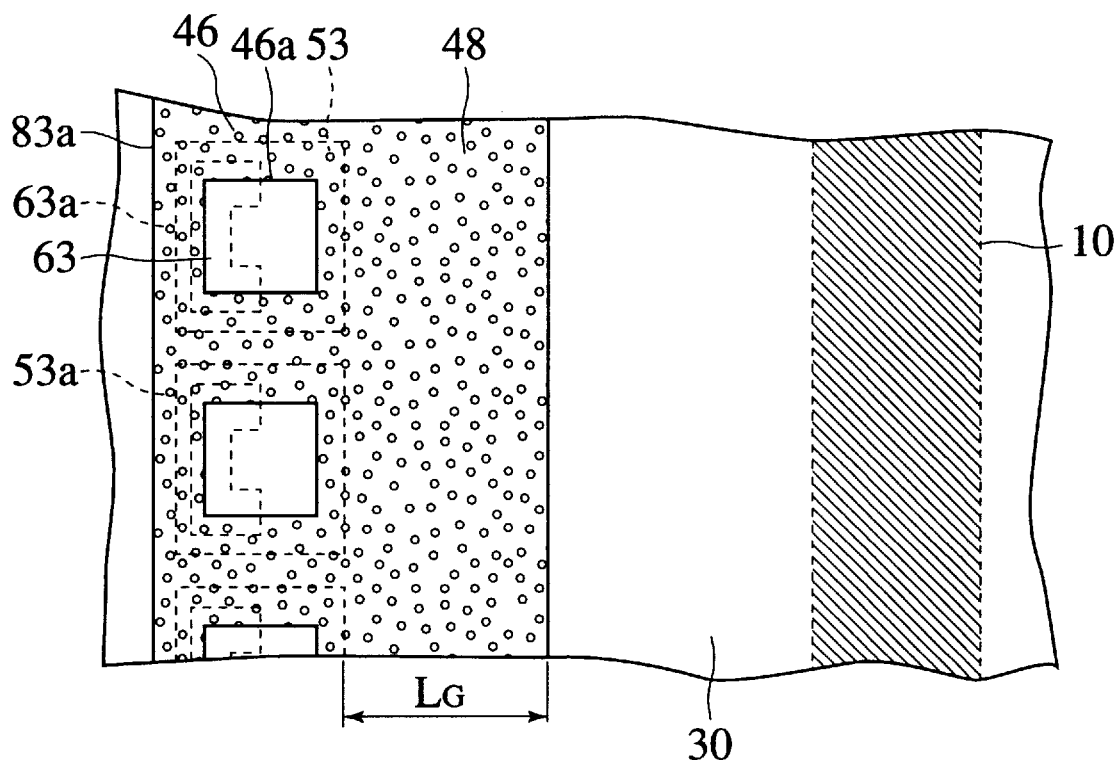

FIGS. 12A to 12D are plan views showing other IGBTs according to the fifth embodiment. Each of them has a wide gate electrode to cover a wide area of an N-type epitaxial layer 30 serving as a drift region. More precisely, the IGBT of FIG. 12A is based on the second embodiment and has a wider gate electrode 46. The IGBT of FIG. 12B is based on the third embodiment and has a wider gate electrode 47. The IGBT of FIG. 12C is based on the fourth embodiment and has a wider gate electrode 48. As explained in the respective embodiments, these IGBTs prevent the latch-up and reduce the saturation voltage.

Figure 12D:
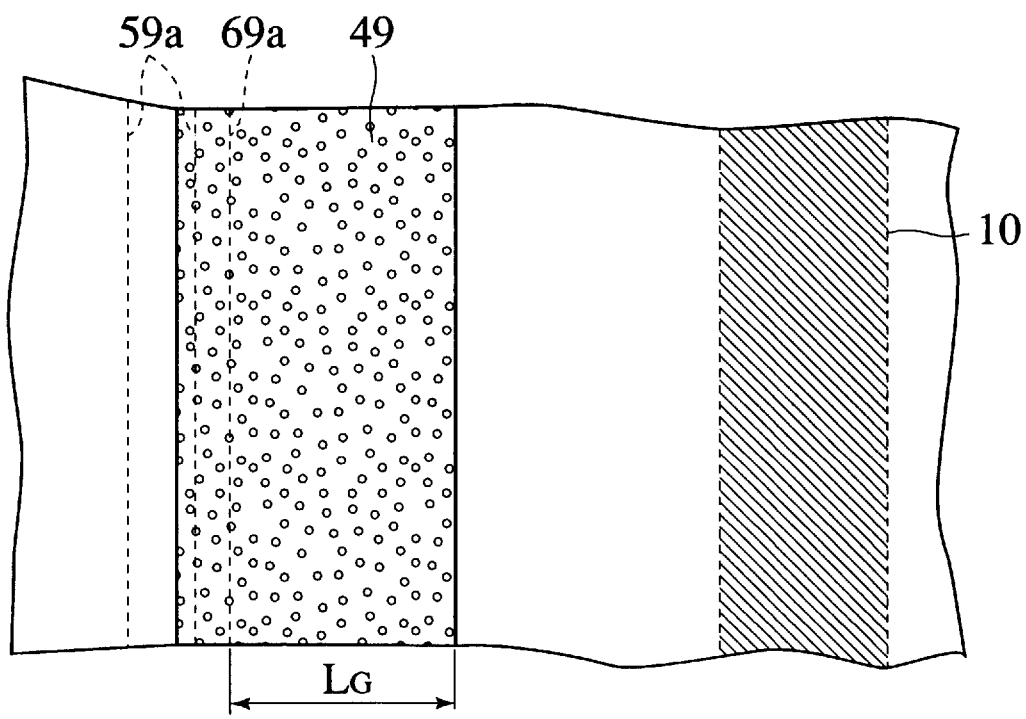
Figure 13:
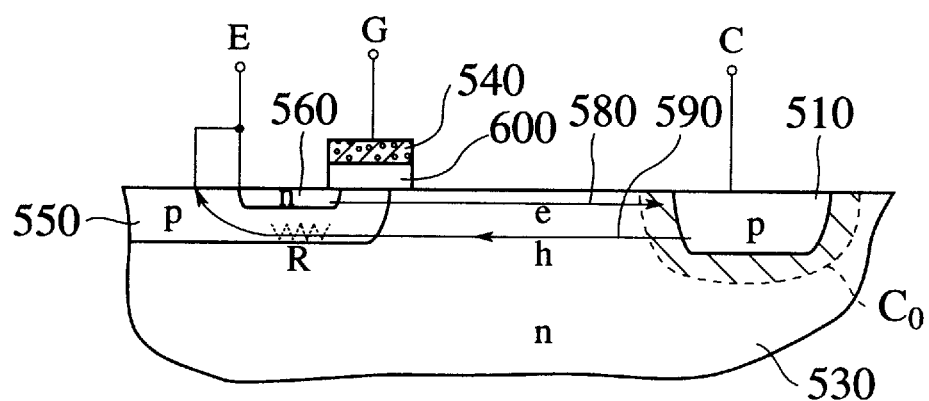
FIG. 13 is a sectional view showing an IGBT according to the prior art.
Figure 14A:
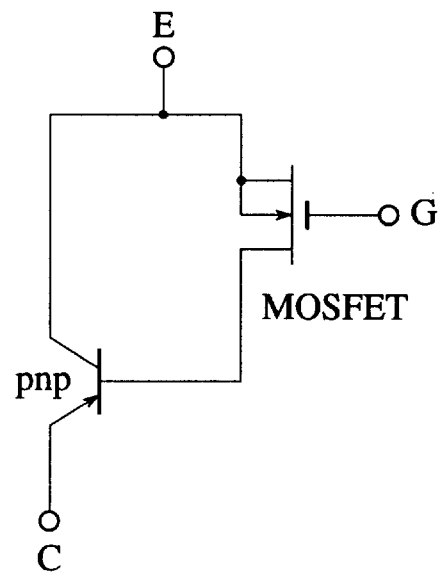
FIGS. 14A and 14B are circuit diagrams showing an equivalent circuit of the IGBT of FIG. 13 and an equivalent circuit of the same with a parasitic transistor.
Figure 14B:
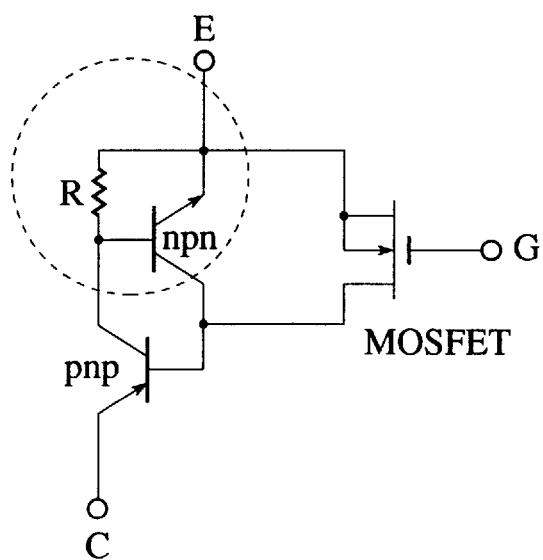
Figure 15A:
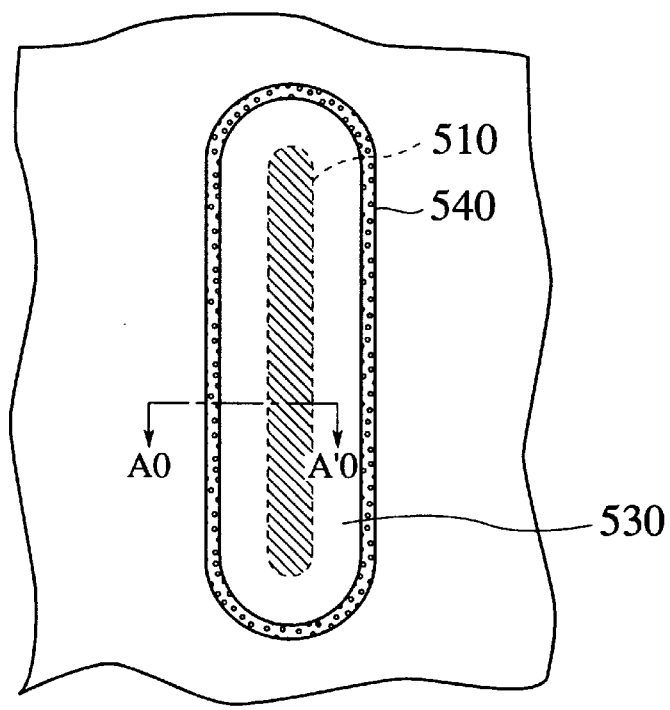
FIGS. 15A and 15B are plan views showing the IGBT of FIG. 13.
Figure 15B:
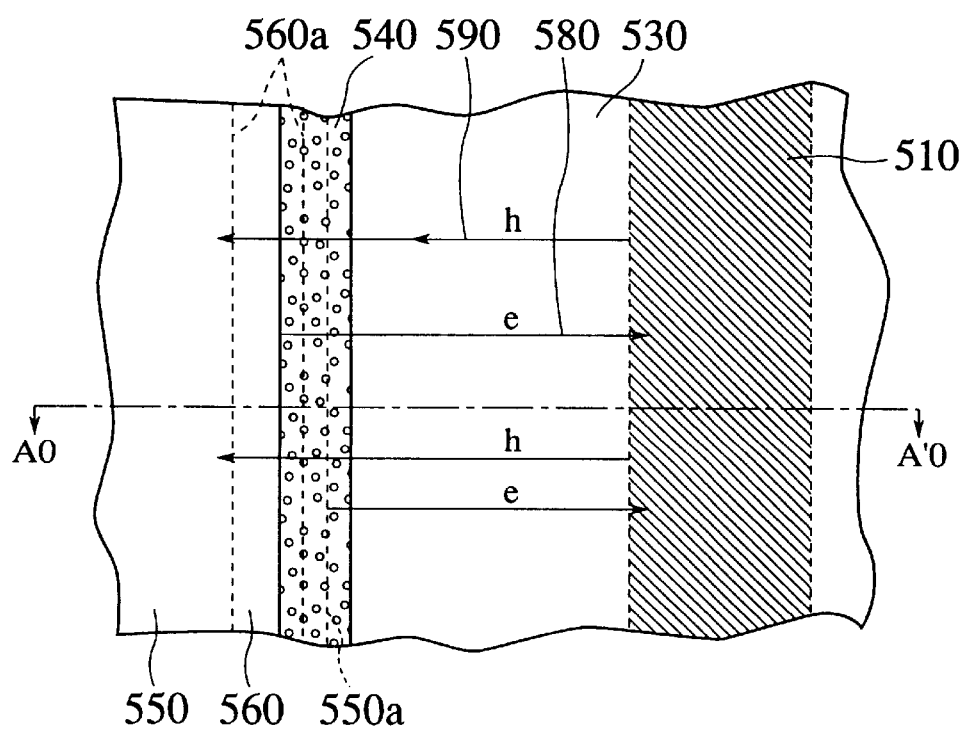

The IGBT of FIG. 12D is based on the prior art of FIG. 15B and has a wider gate electrode 49. This structure is also capable of reducing the saturation voltage.

In any case, it is preferable that the distance LG between the base region serving as a hole drift region and the gate electrode is about three times to longer than the MOSFET electron channel length Lc of the IGBT.

Although the present invention has been explained with reference to the first to fifth embodiments, the present invention is not limited to them. For example, the present invention is applicable also to IGBTs having opposite conductivity types from those of the embodiments that employ an N-type emitter region, a P-type base region, and an N-type epitaxial layer.

The plan views used to explain the first to fifth embodiments do not show emitter and collector electrodes. The emitter electrode must electrically be connected to the N-type emitter region and P-type base region, and the collector electrode to the P-type collector region. The shapes of the emitter and collector electrodes are not particularly limited. For example, as shown in FIG. 3D, the electrodes may widely be formed on the interlayer insulation film and connected to the respective diffusion regions through contact holes. Other changes, modifications, combinations related to the present invention will be apparent to those skilled in the art.

What is claimed is:

1. A lateral insulated gate bipolar transistor comprising:
a first semiconductor layer of a first conductivity type;
a base region of a second conductivity type formed at the surface of said first semiconductor layer;
an emitter region of the first conductivity type formed at a part of the surface of said base region;
a gate insulation film to partly cover the exposed surfaces of said emitter region, base region, and first semiconductor layer;
a gate electrode formed on said gate insulation film, to cover the same area as said gate insulation film;
a collector region of the second conductivity type formed at the surface of said first semiconductor layer independently of said base region;
an emitter electrode electrically connected to said emitter region and base region; and
a collector electrode electrically connected to said collector region,
said emitter region being displaced from a main path for passing carriers from said collector region to said base region through said first semiconductor layer.

2. A lateral insulated gate bipolar transistor comprising:
a first semiconductor layer of a first conductivity type;
a base region of a second conductivity type formed at the surface of said first semiconductor layer;
an emitter region of the first conductivity type formed at a part of the surface of said base region;
a gate insulation film to partly cover the exposed surfaces of said emitter region, base region, and first semiconductive layer;
a gate electrode formed on said gate insulation film, to cover the same area as said gate insulation film;
a collector region of the second conductivity type formed at the surface of said first semiconductor layer independently of said base region;
an emitter electrode electrically connected to said emitter region and base region; and
a collector electrode electrically connected to said collector region,
a boundary of said base region facing said collector region having regular repeated convex-concave shape in a plan view,
said emitter region being displaced from a shortest straight path connecting said collector region and said base region.

3. A lateral insulated gate bipolar transistor comprising:
a first semiconductor layer of a first conductivity type;

a base region of a second conductivity type formed at the surface of said first semiconductor layer;

an emitter region of the first conductivity type formed at a part of the surface of said base region;

a gate insulation film to partly cover the exposed surfaces of said emitter region, base region, and first semiconductor layer;

a gate electrode formed on said gate insulation film, to cover the same area as said gate insulation film;

a collector region of the second conductivity type formed at the surface of said first semiconductor layer independently of said base region;

an emitter electrode electrically connected to said emitter region and base region; and a collector electrode electrically connected to said collector region, in a plan view, said gate electrode being loop to surround said collector region with a predetermined gap between them, said base region and emitter region being formed by an ion implantation technique in a self-aligning manner with said gate electrode serving as a mask, an outer boundary of said gate electrode having regular repeated convex-concave shape in a plan view, said emitter region being displaced from a shortest straight path connecting the outer boundary of said gate electrode and said collector region.

4. The lateral insulated gate bipolar transistor as claimed in claim 3, wherein:

said gate electrode has a comb shape in a plan view with the outer boundary thereof defining teeth of the comb;

said base region has, in a plan view, an inner boundary having regular repeated convex-concave shape along with a boundary of said gate electrode; and said emitter region has, in a plan view, a rectangular shape and is formed under each side edge of each tooth of said gate electrode.

5. The lateral insulated gate bipolar transistor as claimed in claim 4, wherein:

each tooth of said gate electrode is narrowed at the bottom thereof in a plan view; and said emitter region is formed under each side edge of an outer part of each tooth of said gate electrode in a plan view.

6. The lateral insulated gate bipolar transistor as claimed in claim 4, wherein:

the outer boundary of said gate electrode has a wave-shape in a plan view;

said base region has, in a plan view, a boundary that extends inside and analogous to the outer boundary of said gate electrode; and said emitter region has, in a plan view, a rectangular shape and is formed under each side edge of each crest of the outer boundary of said gate electrode.

7. A lateral insulated gate bipolar transistor comprising:

a first semiconductor layer of a first conductivity type;

a base region of a second conductivity type formed at the surface of said first semiconductor layer;

an emitter region of the first conductivity type formed at a part of the surface of said base region;

a gate insulation film to partly cover the exposed surfaces of said emitter region, base region, and first semiconductor layer;

a gate electrode formed on said gate insulation film, to cover the same area as said gate insulation film;

a collector region of the second conductivity type formed at the surface of said first semiconductor layer independently of said base region;

an emitter electrode electrically connected to said emitter region and base region; and a collector electrode electrically connected to said collector region, said gate electrode being annular to surround said collector region with a predetermined gap between them, said gate electrode having a row of rectangular openings formed at regular intervals along the length of said gate electrode, said base region and emitter region being formed in a self-aligning manner by implanting ions into each of the openings with said gate electrode serving as a mask, said base region being formed by implanting ions into the whole of each of the openings, said emitter region being formed at each of the openings except a part of the opening proximal to said collector region.

8. The lateral insulated gate bipolar transistor as claimed in any one of claims 1 to 7, wherein said first semiconductor layer is surrounded with a dielectric layer.

9. A lateral insulated gate bipolar transistor comprising:

a first semiconductor layer of a first conductivity type;

a base region of a second conductivity type formed at the surface of said first semiconductor layer;

an emitter region of the first conductivity type formed at a part of the surface of said base region;

a gate insulation film to partly cover the exposed surfaces of said emitter region, base region, and first semiconductor layer;

a gate electrode formed on said gate insulation film, to cover the same area as said gate insulation film;

a collector region of the second conductivity type formed at the surface of said first semiconductor layer independently of said base region;

an emitter electrode electrically connected to said emitter region and base region; and a collector electrode electrically connected to said collector region, the width (LG) of the gate electrode of covering a main path formed in said first semiconductor layer for passing carriers from said collector region to said base region being in the range of three times greater than the length (Lc) of a channel formed under said gate electrode for passing carriers of the other type.

10. The lateral insulated gate bipolar transistor as claimed in any one of claims 1 to 7, wherein the width (LG) of the gate electrode of covering a main path formed in said first semiconductor layer for passing carriers from said collector region to said base region is in the range of three times greater than the length (Lc) of a channel formed under said gate electrode for passing carriers of the other type.

11. The lateral insulated gate bipolar transistor as claimed in clam 8, wherein the width (LG) of the gate electrode of covering a main path formed in said first semiconductor layer for passing carriers from said collector region to said base region is in the range of three times greater than the length (Lc) of a channel formed under said gate electrode for passing carriers of the other type.

* * * * *